United States Patent
Lv

(10) Patent No.: US 12,520,590 B2
(45) Date of Patent: Jan. 6, 2026

(54) THIN FILM TRANSISTOR AND MANUFACTURING METHOD THEREFOR, AND DISPLAY APPARATUS

(71) Applicant: BOE TECHNOLOGY GROUP CO., LTD., Beijing (CN)

(72) Inventor: Yang Lv, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 670 days.

(21) Appl. No.: 17/779,327

(22) PCT Filed: Jul. 8, 2021

(86) PCT No.: PCT/CN2021/105319
§ 371 (c)(1),
(2) Date: May 24, 2022

(87) PCT Pub. No.: WO2022/028203
PCT Pub. Date: Feb. 10, 2022

(65) Prior Publication Data
US 2022/0406820 A1      Dec. 22, 2022

(30) Foreign Application Priority Data
Aug. 4, 2020   (CN) .......................... 202010774215.4

(51) Int. Cl.
*H10D 86/60*      (2025.01)
*H10D 30/01*      (2025.01)
(Continued)

(52) U.S. Cl.
CPC ......... *H10D 86/60* (2025.01); *H10D 30/0314* (2025.01); *H10D 30/0321* (2025.01);
(Continued)

(58) Field of Classification Search
CPC ........... H10D 30/6745; H10D 30/0321; H10D 30/6757; H10D 30/6731; H10D 30/021;
(Continued)

(56) References Cited

U.S. PATENT DOCUMENTS

2017/0005115 A1    1/2017  Wang et al.
2017/0103890 A1    4/2017  Xu et al.
(Continued)

FOREIGN PATENT DOCUMENTS

CN   101834189 A    9/2010
CN   104505404 A    4/2015
(Continued)

OTHER PUBLICATIONS

Second Office Action for Chinese Patent Application No. 202010774215.4 issued by the Chinese Patent Office on Apr. 28, 2023.
(Continued)

*Primary Examiner* — Vongsavanh Sengdara
(74) *Attorney, Agent, or Firm* — XSENSUS LLP

(57) ABSTRACT

A thin film transistor includes a substrate and an active layer having a channel region. The active layer includes a first active pattern and at least one second active pattern. The first active pattern includes a bottom surface, a top surface and at least one side surface. The at least one side surface connects the bottom and top surfaces, and is in contact with the at least one second active pattern. A length direction of each side surface is approximately perpendicular to a length direction of the channel region. A material of at least the top surface of the first active pattern includes a first polysilicon material, and a material of the second active pattern includes a second polysilicon material; and in the length direction of
(Continued)

the channel region, an average grain size of the first polysilicon material is greater than an average grain size of the second polysilicon material.

10 Claims, 21 Drawing Sheets

(51) Int. Cl.
*H10D 30/67* (2025.01)
*H10D 86/01* (2025.01)
*H10D 86/40* (2025.01)
(52) U.S. Cl.
CPC ..... *H10D 30/6731* (2025.01); *H10D 30/6745* (2025.01); *H10D 30/6757* (2025.01); *H10D 86/0229* (2025.01); *H10D 86/425* (2025.01)
(58) Field of Classification Search
CPC ........... H10D 30/0314; H10D 86/0229; H10D 86/60; H10D 86/425
See application file for complete search history.

(56) References Cited

U.S. PATENT DOCUMENTS

| | | | |
|---|---|---|---|
| 2019/0245063 A1 | 8/2019 | Mizumura | |
| 2020/0043729 A1 | 2/2020 | Tanaka et al. | |
| 2021/0193841 A1* | 6/2021 | He | H10D 62/82 |
| 2021/0234048 A1* | 7/2021 | Ohta | H10D 30/6746 |
| 2021/0234049 A1* | 7/2021 | Ohta | H10D 30/0321 |
| 2021/0296505 A1* | 9/2021 | Ohta | H10D 30/0321 |
| 2021/0343878 A1* | 11/2021 | Ohta | H01L 21/0262 |

FOREIGN PATENT DOCUMENTS

| | | |
|---|---|---|
| CN | 104538310 A | 4/2015 |
| CN | 105513950 A | 4/2016 |
| CN | 106876480 A | 6/2017 |
| CN | 107615451 A | 1/2018 |
| CN | 104934372 B | 3/2018 |
| CN | 105742370 B | 1/2019 |
| JP | 2020-21787 A | 2/2020 |

OTHER PUBLICATIONS

Office Action for the Chinese Patent Application No. 202010774215.4 issued by the Chinese Patent Office on Aug. 18, 2022.

* cited by examiner

THIN FILM TRANSISTOR AND MANUFACTURING METHOD THEREFOR, AND DISPLAY APPARATUS

CROSS-REFERENCE TO RELATED APPLICATIONS

The present disclosure is a national phase entry under 35 USC 371 of International Patent Application No. PCT/CN2021/105319, filed on Jul. 8, 2021, which claims priority to Chinese Patent Application No. 202010774215.4, filed on Aug. 4, 2020, which are incorporated herein by reference in their entirety.

TECHNICAL FIELD

The present disclosure relates to the field of display technologies, and in particular, to a thin film transistor and a manufacturing method therefor, and a display apparatus.

BACKGROUND

In a driving circuit of a display panel, the most used devices are thin film transistors (TFTs), and the thin film transistors are field effect transistors. In the driving circuit, the function of the TFT is a three-terminal switch, the three terminals are, for example, a gate, a source and a drain. When the gate is turned on, a signal can be transmitted from the source to the drain.

SUMMARY

In one aspect, a thin film transistor is provided. The thin film transistor includes a substrate and an active layer disposed on the substrate.

The active layer has a channel region, the active layer includes a first active pattern and at least one second active pattern, and at least part of the first active pattern is located in the channel region.

The first active pattern includes a bottom surface, a top surface and at least one side surface, the bottom surface and the top surface are arranged opposite to each other in a thickness direction of the substrate, and the bottom surface is further close to the substrate; the at least one side surface connects the bottom surface and the top surface, and is in contact with the at least one second active pattern, and a length direction of each side surface of the at least one side surface is approximately perpendicular to a length direction of the channel region. A material of at least the top surface of the first active pattern includes a first polysilicon material, a material of the at least one second active pattern includes a second polysilicon material; in the length direction of the channel region, an average grain size of the first polysilicon material is greater than an average grain size of the second polysilicon material.

In some embodiments, the thin film transistor further includes an etch stop pattern disposed on the top surface of the first active pattern. An orthogonal projection of the first active pattern on the substrate is located within an orthogonal projection of the etch stop pattern on the substrate, and the orthogonal projection of the etch stop pattern on the substrate is non-overlapping with an orthogonal projection of the at least one second active pattern on the substrate.

In some embodiments, the at least one side surface includes a first side surface and a second side surface that are arranged opposite to each other in the length direction of the channel region. The at least one second active pattern includes second active patterns, and a second active pattern is in contact with the first side surface, and another second active pattern is in contact with the second side surface.

In some embodiments, the active layer includes at least one third active pattern, and a material of the at least one third active pattern is amorphous silicon.

The at least one third active pattern is disposed on at least one side of an active pattern group in the length direction of the channel region.

The active pattern group includes the first active pattern and the at least one second active pattern.

In some embodiments, the at least one third active pattern includes third active patterns, and the third active patterns are disposed on sides of an active pattern group in the length direction of the channel region.

In some embodiments, the at least one third active pattern includes one third active pattern, and the third active pattern is arranged around the active pattern group.

In some embodiments, a border of the orthogonal projection of the first active pattern on the substrate substantially coincides with a border of the orthographic projection of the etch stop pattern on the substrate.

In some embodiments, the thin film transistor further includes an ohmic contact pattern disposed on a side of the active layer away from the substrate, and the ohmic contact pattern is in contact with the active layer.

In some embodiments, the thin film transistor further includes a gate disposed on a side of the active layer proximate to the substrate, or disposed on a side of the active layer away from the substrate.

In some embodiments, a material of the entire first active pattern is the first polysilicon material, or further includes a third polysilicon material; an average grain size of the third polysilicon material is less than the average grain size of the first polysilicon material.

In some embodiments, the thin film transistor further includes a source and a drain that are disposed on a side of the at least one second active pattern away from the substrate, the source and the drain being electrically connected to the active layer.

In another aspect, a display apparatus is provided. The display apparatus includes the thin film transistor according to any one of the above embodiments.

In yet another aspect, a manufacturing method for a thin film transistor is provided. The method includes:

forming an active layer having a channel region, including:

forming a first semiconductor pattern and an etch stop pattern that are stacked on a substrate; wherein at least part of the first semiconductor pattern is located in the channel region, the first semiconductor pattern includes a bottom surface, a top surface and at least one side surface; the bottom surface and the top surface are arranged opposite to each other in a thickness direction of the substrate, the bottom surface is further close to the substrate, and the at least one side surface connects the bottom surface and the top surface; a length direction of each side surface of the at least one side surface is approximately perpendicular to a length direction of the channel region, an orthogonal projection of the first semiconductor pattern on the substrate is located within an orthogonal projection of the etch stop pattern on the substrate, and a material of the first semiconductor pattern is amorphous silicon or a third polysilicon material;

forming a second semiconductor film on the substrate on which the first semiconductor pattern and the etch stop pattern are formed, wherein the second semiconductor film is in contact with at least the etch stop pattern and the first semiconductor pattern, a material of the second semiconductor film is amorphous silicon; and patterning the second semiconductor film to form at least one second semiconductor pattern, the at least one second semiconductor pattern being in contact with the at least one side surface of the first semiconductor pattern;

irradiating the first semiconductor pattern and at least part of the at least one second semiconductor pattern with a first laser light, and the at least part of the at least one second semiconductor pattern being in contact with the first semiconductor pattern, so that amorphous silicon in the at least part of the at least one second semiconductor pattern that is irradiated is converted into grains in a second polysilicon material, and the material of at least the top surface of the first semiconductor pattern is converted into grains in a first polysilicon material; in the length direction of the channel region, an average grain size of the first polysilicon material is greater than an average grain size of the second polysilicon material and an average grain size of the third polysilicon material.

In some embodiments, the at least one second semiconductor pattern includes one second semiconductor pattern, irradiating the at least part of the at least one second semiconductor pattern with the first laser light includes: irradiating part of the second semiconductor pattern with the first laser light, so that part of the second semiconductor pattern that is not irradiated by the first laser light forms a third active pattern.

In some embodiments, the at least one second semiconductor pattern includes one second semiconductor pattern, irradiating the at least part of the at least one second semiconductor pattern with the first laser light includes: irradiating parts of the second semiconductor pattern with the first laser light, so that part of the second semiconductor pattern that is not irradiated by the first laser light forms at least one third active pattern.

In some embodiments, the at least one second semiconductor pattern includes second semiconductor patterns, irradiating the at least part of the at least one second semiconductor pattern with the first laser light includes: irradiating part of a second semiconductor pattern of the second semiconductor patterns with the first laser light, so that part of the second semiconductor pattern that is not irradiated by the first laser light forms a third active pattern, and another second semiconductor pattern of the second semiconductor patterns that is not irradiated by the first laser light entirely forms another third active pattern.

In some embodiments, the at least one second semiconductor pattern includes second semiconductor patterns, irradiating the at least part of the at least one second semiconductor pattern with the first laser light includes: irradiating part of each second semiconductor pattern with the first laser light, so that part of each second semiconductor pattern that is not irradiated by the first laser light forms a third active pattern.

In some embodiments, forming the first semiconductor pattern and the etch stop pattern that are stacked on the substrate includes:

forming a first semiconductor film on a side of the substrate, a material of the first semiconductor film being amorphous silicon or the third polysilicon material;

forming a first insulating film on a side of the first semiconductor film away from the substrate; and patterning the first insulating film and the first semiconductor film through a same patterning process to form the first semiconductor pattern and the etch stop pattern that are stacked;

alternatively, forming the first semiconductor pattern and the etch stop pattern that are stacked on the substrate includes:

forming the first semiconductor film on a side of the substrate, the material of the first semiconductor film being amorphous silicon or the third polysilicon material; patterning the first semiconductor film to form the first semiconductor pattern; and forming the first insulating film on the substrate on which the first semiconductor pattern is formed; and patterning the first insulating film to form the etch stop pattern.

In some embodiments, the manufacturing method for the thin film transistor further includes: forming an ohmic contact pattern on a side of the active layer away from the substrate, the ohmic contact pattern being in contact with the active layer.

In some embodiments, the manufacturing method for the thin film transistor further includes: forming a source and a drain on a side of the ohmic contact pattern away from the substrate, the source and the drain being electrically connected to the active layer through the ohmic contact pattern.

In some embodiments, before forming the first semiconductor film, the manufacturing method further includes: forming a gate metal film on a side of the substrate, and patterning the gate metal film to form a gate.

In some embodiments, the manufacturing method for a thin film transistor further includes: forming a gate metal film on a side of the etch stop pattern away from the substrate, and patterning the gate metal film to form a gate.

In some embodiments, the material of the first semiconductor film is the third polysilicon material, forming the first semiconductor film on the side of the substrate includes:

forming an amorphous silicon film on the substrate; and irradiating the amorphous silicon film with a second laser light to convert the amorphous silicon in the amorphous silicon film into the grains in the third polysilicon material to form the first semiconductor film.

In some embodiments, for the first laser light, the regional laser annealing process is performed; and for the second laser light, the excimer laser annealing process is performed.

In some embodiments, the manufacturing method for the thin film transistor further includes: removing the etch stop pattern.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings.

In addition, the accompanying drawings to be described below may be regarded as schematic diagrams, and are not limitations on actual sizes of products, actual processes of methods and actual timings of signals to which the embodiments of the present disclosure relate.

DETAILED DESCRIPTION

Figure 1A:
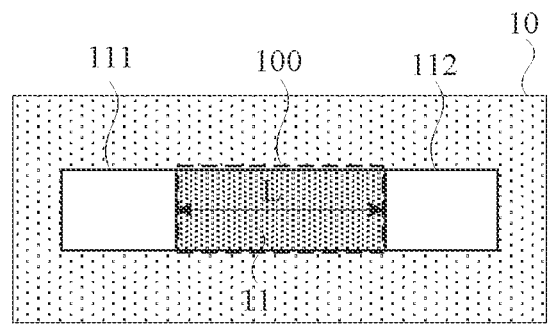
FIGS. 1A to 1C are top views of thin film transistors, in accordance with some embodiments of the present disclosure.

Technical solutions in some embodiments of the present disclosure will be described clearly and completely below with reference to the accompanying drawings. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed in an open and inclusive sense, i.e., "including, but not limited to". In the description, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, specific features, structures, materials or characteristics may be included in any one or more embodiments or examples in any suitable manner.

Hereinafter, the terms "first" and "second" are only used for descriptive purposes, and are not to be construed as indicating or implying relative importance or implicitly indicating the number of indicated technical features. Thus, a feature defined with the term such as "first" or "second" may explicitly or implicitly include one or more of the features. In the description of the embodiments of the present disclosure, the term "a plurality of/the plurality of" means two or more unless otherwise specified.

In the description of some embodiments, terms such as "coupled" and "connected" and derivatives thereof may be used. For example, the term "connected" may be used in the description of some embodiments to indicate that two or more components are in direct physical or electrical contact with each other. For another example, the term "coupled" may be used in the description of some embodiments to indicate that two or more components are in direct physical or electrical contact. However, the term "coupled" or "communicatively coupled" may also mean that two or more components are not in direct contact with each other, but still cooperate or interact with each other. The embodiments disclosed herein are not necessarily limited to the contents herein.

The phrase "at least one of A, B and C" has a same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

As used herein, the term "if", depending on the context, is optionally construed as "when" or "in a case where" or "in response to determining" or "in response to detecting". Similarly, depending on the context, the phrase "if it is determined" or "if [a stated condition or event] is detected" is optionally construed as "in a case where it is determined", "in response to determining", "in a case where [the stated condition or event] is detected", or "in response to detecting [the stated condition or event]".

The use of "applicable to" or "configured to" herein means an open and inclusive expression, which does not exclude devices that are applicable to or configured to perform additional tasks or steps.

Additionally, the use of the phrase "based on" is meant to be open and inclusive, since a process, step, calculation or other action that is "based on" one or more of the stated conditions or values may, in practice, be based on additional conditions or value beyond those stated.

As used herein, the terms such as "about" or "approximately" includes a stated value and an average value within an acceptable range of deviation of a particular value. The acceptable range of deviation is determined by a person of ordinary skill in the art, in consideration of measurement in question and errors associated with the measurement of a particular quantity (i.e., limitations of a measurement system).

As used herein, the phrase "average value" in the present disclosure should be construed as "arithmetic average value". For example, an average size of grains should be construed as "an arithmetic average size of grains".

Exemplary embodiments are described herein with reference to sectional views and/or plan views as idealized exemplary drawings. In the accompanying drawings, thicknesses of layers and sizes of regions are enlarged for clarity. Variations in shapes with respect to the accompanying drawings due to, for example, manufacturing technologies and/or tolerances may be envisaged. Therefore, the exemplary embodiments should not be construed as being limited to the shapes of the regions shown herein, but including shape deviations due to, for example, manufacturing. For example, an etched region shown in a rectangular shape generally has a curved feature. Therefore, the regions shown in the accompanying drawings are schematic in nature, and their shapes are not intended to show actual shapes of the regions in a device, and are not intended to limit the scope of the exemplary embodiments.

Some embodiments of the present disclosure provide a display apparatus. The display apparatus may be, for example, any one of a liquid crystal display (LCD), an organic light-emitting diode (OLED) display apparatus, and a quantum dot light-emitting diode (QLED) display apparatus.

Driving circuits of the display apparatus include a plurality of thin film transistors 1 that are electrically connected to one another and some other devices. The driving circuits include, for example, pixel driving circuits and a gate driver on array (GOA) circuit. The some other devices are, for example, capacitors. The capacitors are, for example, storage capacitors.

For example, the pixel driving circuit is a driving circuit with a 2T1C structure, or a 7T1C structure. The GOA circuit is, for example, a circuit with a 3T1C structure, or an 8T2C structure, etc. The GOA circuit may be a gate driving circuit (a gate GOA circuit) or a light-emitting control circuit (an EM GOA circuit). T represents a thin film transistor, and C represents a capacitor. For example, 2T1C is referred to as a pixel driving circuit including two thin film transistors and one capacitor. Numbers of thin film transistors and capacitors in the pixel driving circuit and the GOA circuit may be selected according to actual needs. Therefore, the numbers of thin film transistors and capacitors in the pixel driving circuit and the GOA circuit are not limited in the present disclosure, and the pixel driving circuits and the GOA circuits listed above are used to illustrate that these driving circuits need to be constituted by thin film transistors.

Based on the above, some embodiments of the present disclosure provide a thin film transistor including an active layer disposed on a substrate. The active layer has a channel region.

For example, a thickness of the active layer is 430 Å to 500 Å.

In some embodiments, the thin film transistor further includes a source and a drain. The source and the drain are electrically connected to the active layer, and a region between the source and the drain in the active layer is a channel region. For example, a signal may be transmitted from the source to the drain through the channel region.

Figure 1B:
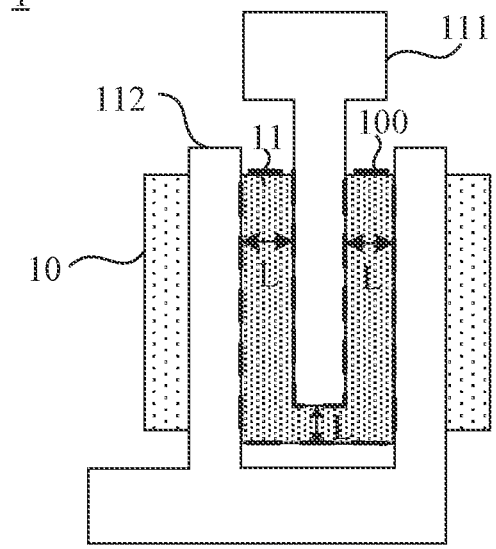
Figure 1C:
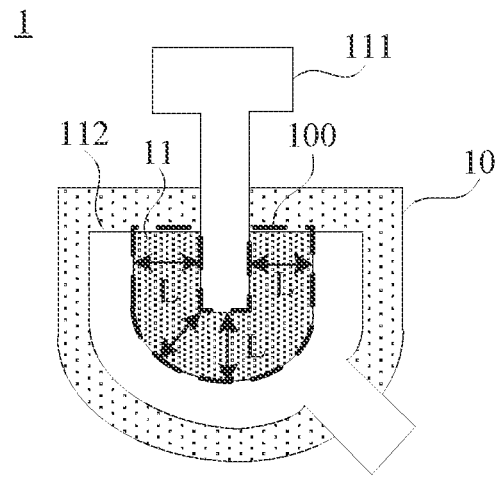

FIGS. 1A to 1C are top structural views of thin film transistors 1. According to the structures and connection relationships among the active layer 10, the source 111 and the drain 112, a shape of the channel region 100 in the active layer 10 is, for example, a rectangle or a U-shape.

For example, referring to FIG. 1A, the channel region 100 of the active layer 10 in the thin film transistor 1 is in a shape of a rectangle, and a length of the channel region 100 is, for example, L. Moreover, L also represents a length direction of the channel region 100.

Referring to FIGS. 1B and 1C, the channel region 100 of the active layer 10 in the thin film transistor 1 is a U-shape.

A maximum length of the channel region 100 is, for example, L, and L also represents a length direction of the channel region 100. In a case where the channel region 100 is a U-shape, the length direction L of the channel region 100 may vary with a trajectory of the U-shape.

FIGS. 2A to 2F are top views of the active layers 10. The active layer 10 includes a first active pattern 11 and second active pattern(s) 12. At least part of the first active pattern 11 is located in the channel region 100.

The first active pattern 11 includes a bottom surface, a top surface and at least one side surface. The bottom surface and the top surface are arranged opposite to each other in a thickness direction of the substrate 2, and the bottom surface is further close to the substrate 2.

The at least one side surface connects the bottom surface and the top surface, the at least one side surface is in contact with the second active pattern(s) 12, and a length direction of each side surface of the at least one side surface is perpendicular or approximately perpendicular to the length direction of the channel region 100.

The at least one side surface will be understood as a side surface that is in contact with the second active pattern(s) 12 and whose length direction is perpendicular to the length direction L of the channel region 100, and the at least one side surface does not include side surface(s) whose length directions are not perpendicular to the length direction L of the channel region 100 even if they connect the bottom surface and the top surface of the first active pattern 11, and/or side surface(s) that are not in contact with the second active pattern(s) 12. The phrase "being in contact with the second active pattern(s) 12" may be understood as being in direct contact with the second active pattern(s) 12.

Figure 2A:
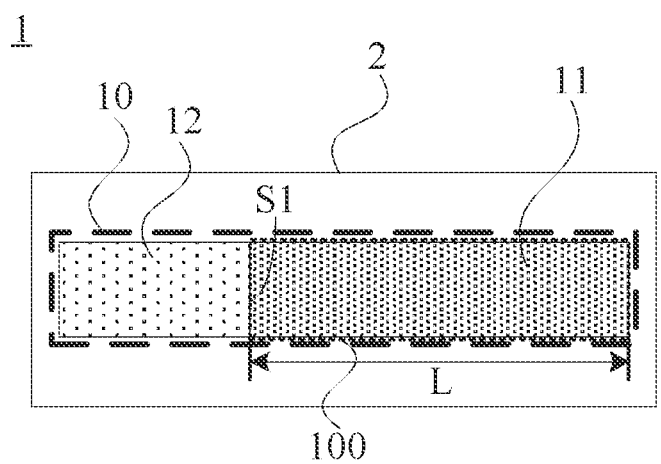
FIGS. 2A to 2G are top views of other thin film transistors, in accordance with some embodiments of the present disclosure.
Figure 2B:
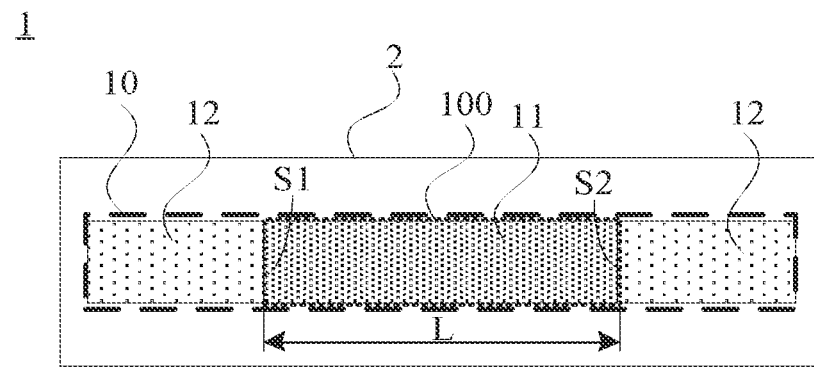

For example, for the structure of the thin film transistor 1 shown in FIG. 1A, the structure of the active layer 10 of the thin film transistor 1 is, for example, as shown in FIGS. 2A and 2B.

Referring to FIG. 2A, the shape of the channel region 100 is a rectangle, and a side surface that is in contact with the second active pattern 12 and whose length direction is perpendicular to the length direction L of the channel region 100 is a first side surface S1.

Referring to FIG. 2B, the shape of the channel region 100 is a rectangle, and the side surfaces that are in contact with the second active patterns 12 and whose length directions are perpendicular to the length direction L of the channel region 100 are a first side surface S1 and a second side surface S2. The first side surface S1 and the second side surface S2 are arranged opposite to each other in the length direction L of the channel region 100.

In the first side surface S1 and the second side surface S2 arranged opposite to each other in the length direction L of the channel region 100, there is one or more first side surfaces S1 and one or more second side surfaces S2. For example, there are a plurality of first side surfaces S1 and a plurality of second side surfaces S2. In the plurality of first side surfaces S1, a corner exists between two adjacent side surfaces; in the plurality of second side surfaces S2, a corner also exists between two adjacent side surfaces.

Figure 2C:
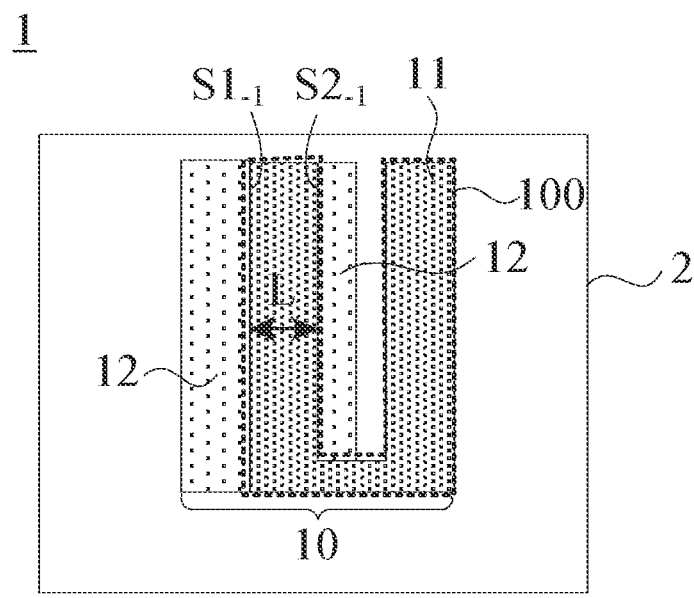
Figure 2D:
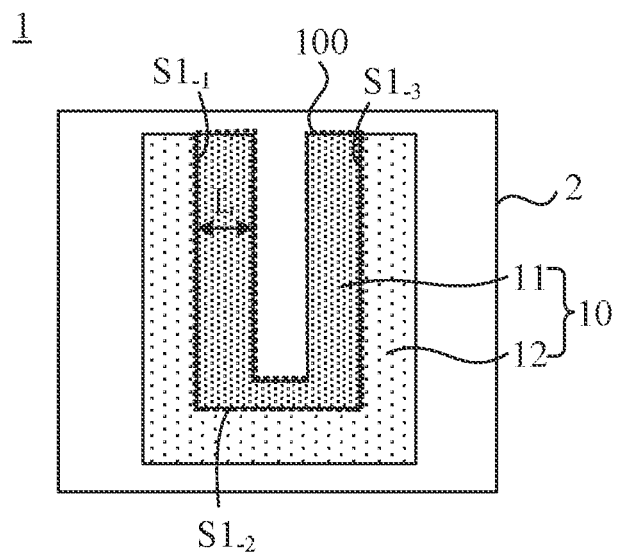
Figure 2E:
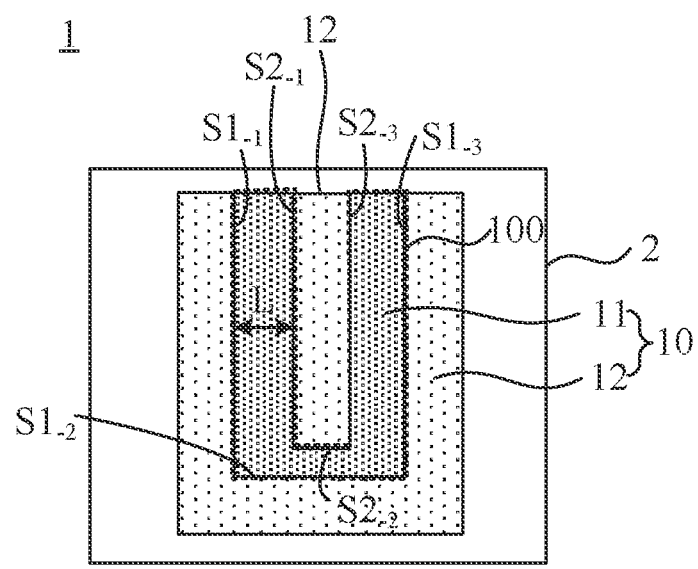

For the structure of the thin film transistor 1 shown in FIG. 1B, the structure of the active layer 10 is, for example, as shown in FIGS. 2C to 2E. The shape of the channel region 100 in the active layer 10 is a U-shape, the side surface that is in contact with the second active layer(s) 12 and whose length directions are perpendicular to the length direction L of the channel region 100 include at least one first side surface S1 and at least one second side surface S2. As shown in FIGS. 2D and 2E, in a case where there are a plurality of first side surfaces S1 and a plurality of second side surfaces S2, the plurality of first side surfaces S1 are, for example, a first side surface $S1_{-1}$, a first side surface $S1_{-2}$ and a first side surface $S1_{-3}$ that are connected in sequence; the plurality of second side surfaces S2 are, for example, a second side surface $S2_{-1}$, a second side surface $S2_{-2}$ and a second side surface $S2_{-3}$.

Referring to FIG. 2C, there is one side surface $S1_{-1}$ and one second side surface $S2_{-1}$ that are in contact with the second active patterns 12 and whose length directions are perpendicular to the length direction L of the channel region 100. The second active patterns 12 are in contact with the first side surface $S1_{-1}$ and the second side surface $S2_{-1}$.

Referring to FIG. 2D, there are a plurality of first side surfaces S1 (i.e., the first side surface $S1_{-1}$, the first side surface $S1_{-2}$, and the first side surface $S1_{-3}$ that are connected in sequence) that are in contact with the second active pattern 12 and whose length directions are perpendicular to the length direction L of the channel region 100.

Referring to FIG. 2E, there are a plurality of first side surfaces S1 and a plurality of second side surfaces S2 that are in contact with the second active patterns 12 and whose length directions are perpendicular to the length direction L of the channel region 100. The plurality of first side surfaces S1 are, for example, the first side surface $S1_{-1}$, the first side surface $S1_{-2}$ and the first side surface $S1_{-3}$ that are connected in sequence; the plurality of second sides S2 are, for example, the second side surface $S2_{-1}$, the second side surface $S2_{-2}$ and the second side surface $S2_{-3}$ that are connected in sequence. The first side surface $S1_{-1}$ and the second side surface $S2_{-1}$ are arranged opposite to each other in the length direction L of the channel region 100, the first side surface $S1_{-2}$ and the second side surface $S2_{-2}$ are arranged opposite to each other in the length direction L of the channel region 100, the first side surface $S1_{-3}$ and the second side surface $S2_{-3}$ are arranged opposite to each other in the length direction L of the channel region 100.

Figure 2F:
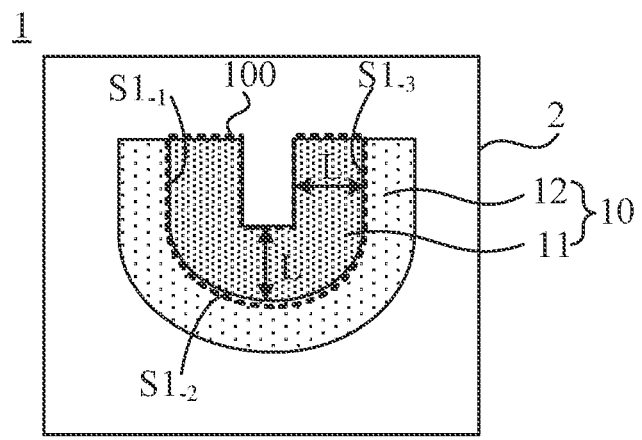
Figure 2G:
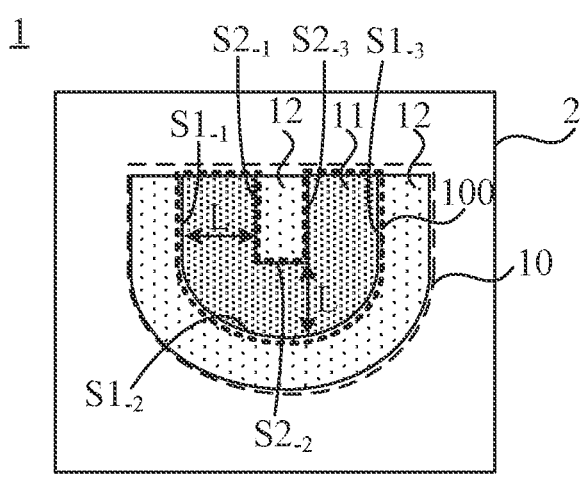

For the structure of the thin film transistor 1 shown in FIG. 1C, the structure of the active layer 10 is, for example, referred to FIGS. 2F and 2G.

Referring to FIG. 2F, the shape of the channel region 100 is a U-shape, and side surfaces that are in contact with the second active pattern 12 and whose length directions are perpendicular to the length direction L of the channel region 100 include a plurality of first side surfaces S1, that is, a first side surface $S1_{-1}$, a first side surface $S1_{-2}$ and a first side surface $S1_{-3}$ that are connected in sequence.

Referring to FIG. 2G, the shape of the channel region 100 is a U-shape, and side surface that are in contact with the second active patterns 12 and whose length directions are perpendicular to the length direction L of the channel region 100 include a plurality of first side surfaces S1 and a plurality of second side surfaces S2. The plurality of first side surfaces S1 are, for example, a first side surface $S1_{-1}$, a first side surface $S1_{-2}$ and a first side surface $S1_{-3}$ that are connected in sequence; the plurality of second sides S2 are, for example, a second side surface $S2_{-1}$, a second side surface $S2_{-2}$ and a second side surface $S2\text{-}s$ that are connected in sequence. The first side surface $S1_{-1}$ and the second side surface $S2_{-1}$ are arranged opposite to each other in the length direction L of the channel region 100, the first side surface $S1_{-2}$ and the second side surface $S2_{-2}$ are arranged opposite to each other in the length direction L of the channel region 100, and the first side surface $S1_{-3}$ and the second side surface $S2_{-3}$ are arranged opposite to each other in the length direction L of the channel region 100.

In some embodiments, in a case where the second active pattern(s) 12 are in contact with the first side surface S1 and the second side surface S2 that are arranged opposite to each other, it is beneficial to manufacturing the first active pattern 11. For example, referring to FIGS. 2B, 2E and 2G, there are two second active patterns 12, and each second active pattern 12 is in contact with at least one first side surface S1 and at least one second side surface S2.

A material of at least the top surface of the first active pattern 11 includes a first polysilicon material, and a material of the second active pattern 12 includes a second polysilicon material. In the length direction L of the channel region 100, an average grain size of the first polysilicon material is greater than an average grain size of the second polysilicon material.

Since an electron mobility of amorphous silicon (a-si) is less than 1 cm$^2$/V·s, a carrier mobility of the TFT is restricted. By using a low temperature polysilicon (LTPS) technology with a process temperature below 600° C., the electron mobility of the TFT may reach 300 cm$^2$/V·s. Polysilicon (p-si) is a form of elemental silicon.

Figure 3A:
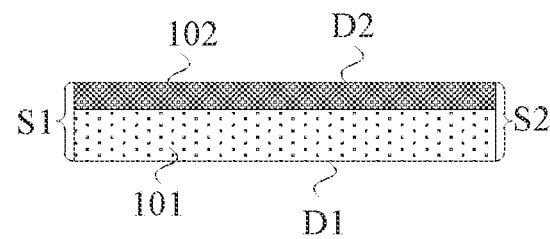
FIGS. 3A and 3B are longitudinal sectional views of first active patterns, in accordance with some embodiments of the present disclosure.

For example, referring to FIG. 3A, which is a longitudinal sectional view of the first active pattern 11 in the thin film transistor 1, the longitudinal section is a section extending in the thickness direction of the substrate 2. The first active pattern 11 is of a two-layer structure, in which a sub-pattern proximate to the bottom surface D1 is a first sub-pattern 101, and a sub-pattern proximate to the bottom surface D2 is a second sub-pattern 102. A material of the first sub-pattern 101 is a third polysilicon material. In the length direction L of the channel region 100, an average grain size of the third polysilicon material is less than the average grain size of the first polysilicon material, and a material of the second sub-pattern 102 is the first polysilicon material. In a case where the material of the second sub-pattern 102 is the first polysilicon material, when the first active pattern 11 is manufactured, since the second sub-pattern 102 is located on a side of the first sub-pattern 101 away from the substrate 2, it is convenient to manufacture the second sub-pattern 102 by using the first polysilicon material. In a case where the first active pattern 11 is of the two-layer structure, an interface between the first sub-pattern 101 and the second sub-pattern 102 may be seen in the longitudinal sectional view of the first active pattern 11.

Figure 3B:
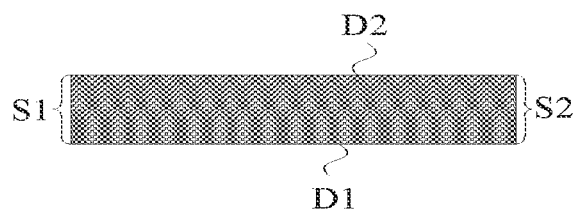
Figure 4:
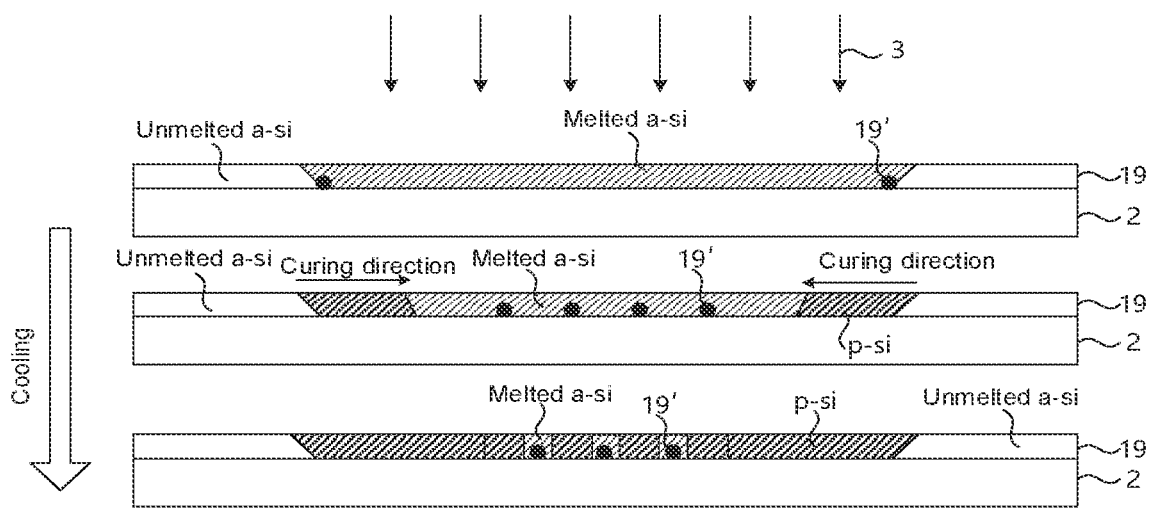
FIG. 4 is a process diagram of amorphous silicon being converted into polysilicon, in accordance with some embodiments of the present disclosure.

For another example, referring to FIG. 3B, which is a longitudinal sectional view of the first active pattern 11 in the thin film transistor 1, the first active pattern 11 is of a single-layer structure. A material of the first active pattern 11 only includes the first polysilicon material, that is, the entire first active pattern 11 is made of the first polysilicon material. In this structure, materials of both the bottom surface D1 and the top surface D2, and a material of a portion between the bottom surface D1 and the top surface D2 are all the first polysilicon material.

p-si grains formed by a LTPS process are composed of small-scale crystallites of S1 atoms. A boundary between two adjacent grains is referred to as a grain boundary. Since the carriers migrate in the length direction of the channel region 100 during the operation of the TFT, the less grain boundaries in the length direction of the channel region 100 exist, the higher the carrier mobility may be. In the LTPS process, the p-si grains may be manufactured by, for example, an excimer laser crystallization (ELC) technology. Depending on different specific process conditions, the ELC technology may include an excimer laser annealing (ELA) technology and a regional laser annealing (e.g., a micro lens array laser annealing (MLA)) technology. In both the ELA and MLA technologies, laser pulses are required to irradiate on a film to be formed as p-si, and crystal nucleuses need to be formed first in a process of forming the p-si grains. For example, referring to FIG. 4, which is a process diagram of a lateral growth (in the length direction of the channel region 100) of the p-si grains, when a shot (the number of shooting times of the laser light 3) of laser light 3 is irradiated onto a surface of a a-si film 19 located on the substrate 2, an energy density of crystallization threshold value may be reached when a temperature of the surface of the a-si film 19 reaches the melting point, and the a-si film 19 may melt penetrating into the inside of the a-si film 19 at a speed of about 10 m/s. The temperature of the a-si film 19 after being irradiated is high in the middle and low at two ends in a length direction thereof, and crystal nucleuses 19' are formed at the boundary between melted portion of the a-si film and unmelted portion of the a-si film. After the irradiation of the laser light 3 is stopped, the molten layer is cooled from two sides thereof at a rate of 108 K/s to 1010 K/s firstly. An interface between a solid phase and a liquid phase moves to the middle and the surface at a speed of 1 m/s to 2 m/s, and the crystal nucleuses 19' are sequentially formed in the middle. After cooling, part of a-si in the a-si film 19 that is irradiated with the laser light 3 is crystallized into p-si, and the p-si grains are formed as a boundary of the crystal nucleuses 19'. The greater the irradiation intensity (energy density) of the laser light 3 is, the larger the size of the p-si grains and the greater the mobility may be. However, the energy is limited by a laser and cannot be increased indefinitely, and the too large energy density may actually decrease the p-si mobility. A range of the lateral growth of the p-si grains in each shot is determined by the energy crystallization threshold value of the excimer laser. A large number of crystal nucleuses 19' are distributed on the boundary of p-si grains, and a material of the crystal nucleus 19' is mainly p-si. For example, an energy density of the laser light 3 in the above process is 300 mJ/cm$^2$ to 400 mJ/cm$^2$, and a frequency thereof is 100 HZ to 100 HZ.

It will be understood from the above process that, the growth process of a grain is divided into two steps, in which the first step is forming a crystal nucleus, and the second step is growing. In the above process of forming the p-si grains, in the molten region of the a-si film 19, since there is no guidance of the crystal nucleus 19' at borders, the crystal nucleuses 19' are randomly formed by a-si in the a-si film 19. As a result, sizes of the formed p-si grains (e.g., lengths) are relatively small. It is found through experiments that, in a case where there are crystal nucleuses 19' on the borders of the molten region of the a-si film 19, the crystal nucleuses 19' may play a guiding role, so that the polysilicon may grow in a direction of complete melting through the crystal nucleuses 19'. Therefore, lateral grains (e.g., lengths of the grains) tend to be greater than a thickness of the film. This process is referred to as super lateral growth. In the present disclosure, instead of the super lateral growth, materials in which p-si grains randomly generated are referred to as the second polysilicon material and the third polysilicon material, and a material in which the p-si grains formed through super lateral growth are referred to as the first polysilicon material. Therefore, it will be noted that, the average grain size of the first polysilicon material is greater than the average grain size of the second polysilicon material and the average grain size of the third polysilicon material. As used herein, the phrase "average grain size" may be understood as average grain length, that is, the average grain length of the first polysilicon material is greater than the average grain length of the second polysilicon material.

Based on the above, although p-si grains in the second polysilicon material and the third polysilicon material are both randomly generated, due to the influence of the laser parameters used in the generation process, the thickness of the film layer used for forming p-si grains in the second polysilicon material, and the thickness of the film layer used for forming p-si grains in the third polysilicon material, the average grain size of the second polysilicon material and the average grain size of the third polysilicon material may be the same or different, and they are both less than the average grain size of the first polysilicon material.

For example, in the length direction L of the channel region 100, in a case where the average grain size of the first polysilicon material is relatively large, a number of grain boundaries in the active layer 10 in the length direction L of the channel region 100 may be reduced, thereby improving the carrier mobility of the TFT.

Figure 5A:
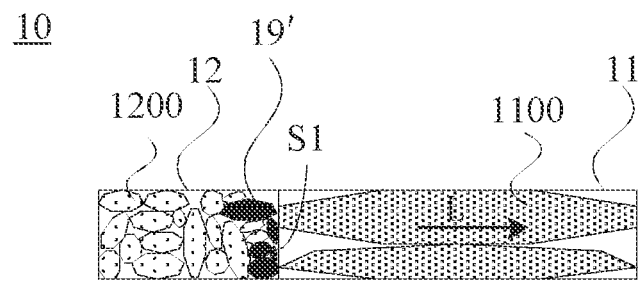
FIGS. 5A and 5B are comparison diagrams of average grain sizes of a first polysilicon material of a first active pattern and a second polysilicon material of a second active pattern, in accordance with some embodiments of the present disclosure.
Figure 5B:
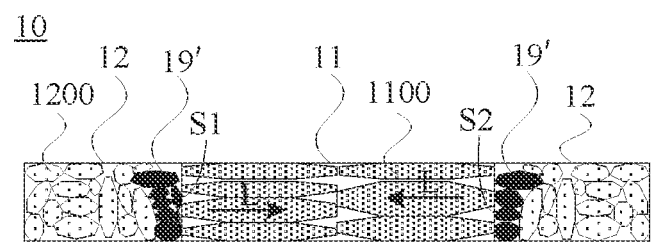

In the embodiments of the present disclosure, referring to FIGS. 5A and 5B, grains 1200 in the second polysilicon material in the second active pattern 12 is mainly used to form the crystal nucleus 19' when grains 1100 in the first polysilicon material in the first active pattern 11 is formed, so that the grains 1100 of the first polysilicon material may laterally grow in the length direction L of the channel region 100, so as to form the grains 1100 in the first polysilicon material with a relatively large size.

For example, referring to FIG. 5A, in a case where there is one second active pattern 12, in the length direction L of the channel region 100, the crystal nucleuses 19' formed by the grains 1200 in the second polysilicon material in the second active pattern 12 cause the grains 1100 in the first polysilicon material to grow, for example, in a direction moving away from the second active pattern 12 (the direction indicated by the arrow in FIG. 5A), so that a length of each grain 1100 in the first polysilicon material is relatively large.

For example, referring to FIG. 5B, in a case where there are two second active patterns 12, in the length direction L of the channel region 100, the crystal nucleus 19' formed by the grains 1200 in the second polysilicon material in each second active pattern 12 cause the grains 1100 in the first polysilicon material to grow in a direction close to a center line of the first active pattern 11 (the directions indicated by two arrows in FIG. 5B).

Figure 6A:
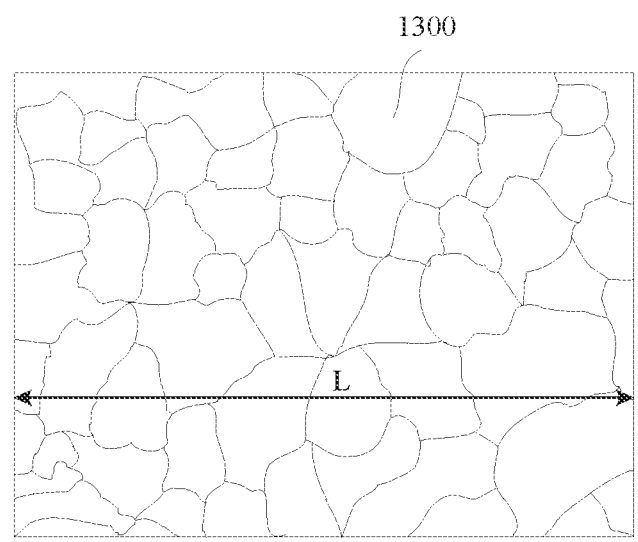
FIG. 6A is a schematic structural diagram of grains in the third polysilicon material, in accordance with some embodiments of the present disclosure.
Figure 6B:
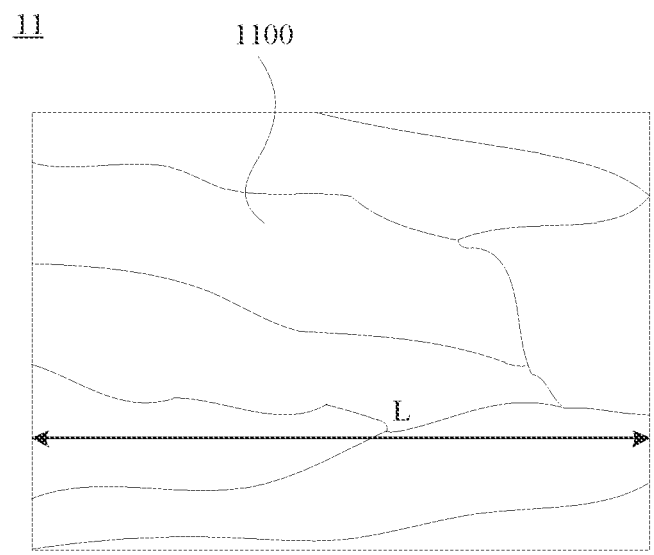
FIG. 6B is a schematic structural diagram of grains in the first polysilicon material, in accordance with some embodiments of the present disclosure.

FIG. 6A is a schematic structural diagram of grains 1300 in the third polysilicon material under a scanning electron microscope (SEM), a boundary between two adjacent grains 1300 in the third polysilicon material is a grain boundary. FIG. 6B is a schematic structural diagram of grains 1100 in the first polysilicon material under a scanning electron microscope, a boundary between two adjacent grains 1100 in the first polysilicon material is a grain boundary. It will be clearly seen from FIGS. 6A and 6B, in the length direction L of the channel region 100, the average length of the grains 1100 in the first polysilicon material is greater than the average length of the grains 1300 in the third polysilicon material. Since the carriers migrate in the length direction L of the channel region 100, the less grain boundaries in the length direction L of the channel region 100 is, the larger the mobility of the carriers is.

At least part of the first active pattern 11 is located in the channel region 100. Since a material of the first active pattern 11 includes the first polysilicon material, and the at least part of the first active pattern 11 is located in the channel region 100, there may be the grains 1100 in the first polysilicon material with a relatively large size in the length direction L of the channel region 100, so that the number of grain boundaries in the length direction L of the channel region 100 may be reduced, and the carrier mobility may be improved. In a case where the first active pattern 11 includes only the first polysilicon material in the thickness direction thereof, the number of the grain boundaries in the first active pattern 11 in the length direction L of the channel region 100 may be further reduced, and the carrier mobility of the channel region 100 may be further improved.

The first active pattern 11 may be entirely located in the channel region 100, or may be partially located in the channel region 100. The drawings of the present disclosure are illustrated by taking an example in which the first active pattern 11 is entirely located in the channel region 100, and the second active pattern 12 does not belong to the channel region 100. It will be understood by those skilled in the art that, no matter the first active pattern 11 is entirely or partially located in the channel region 100, and the second active pattern 12 may be located in the channel region 100 or may not be located in the channel region 100. That is to say, whether the second active pattern 12 entirely or partially belongs the channel region 100 is not limited in the embodiments of the present disclosure. Regardless of whether at least part of the second active pattern 12 is located in the channel region 100, there is always the grains 1100 in first polysilicon material with a relatively large size in the channel region 100 of the present disclosure, which may reduce the number of the grain boundaries in the length direction of the channel region 100.

For example, referring to FIGS. 2B, 2E and 2G, the first active pattern 11 is entirely located in the channel region 100, and the second active pattern 12 is located outside the channel region 100. In this case, a shape of the first active pattern 11 is exactly the same as a shape of the channel region 100.

Figure 7:
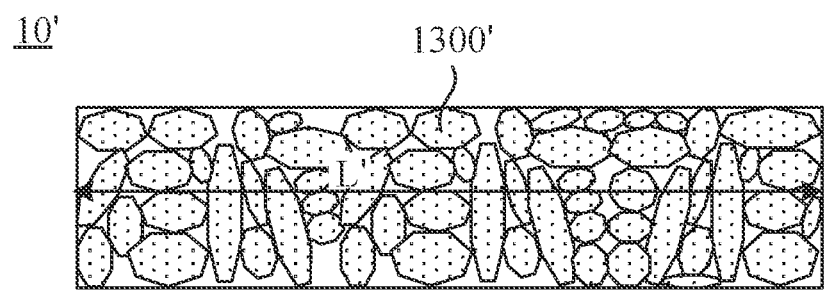
FIG. 7 is a schematic structural diagram of grains in the third polysilicon material in a first active layer, in the related art.

Referring to FIGS. 6A and 7, the active layer 10' in the related art includes only one active pattern, and a material of the active pattern is a polysilicon material with an average grain size less than the average grain size of the first polysilicon material. For example, the polysilicon material is the third polysilicon material. Since the average grain size of grains 1300' in the third polysilicon material is small in the length direction L' of the channel region (the direction indicated by the arrow in FIG. 7), the number of grain boundaries existing in the third polysilicon material is relatively large. As a result, the carrier mobility is less affected by the number of grain boundaries.

However, in the embodiments of the present disclosure, the active layer 10 includes the first active pattern 11 and the second active pattern(s) 12. A material of at least the top surface of the first active pattern 11 includes the first polysilicon material, and at least part of the first active pattern 11 is located in the channel region 100. The material of the second active pattern(s) 12 includes the second polysilicon material, and in the length direction of the channel region 100, a size of the grains 1100 in the first polysilicon material is greater than a size of the grains 1200 in the second polysilicon material. Since the at least part of the first active pattern 11 is located in the channel region 100, the grains 1100 in the first polysilicon material exists in the channel region 100, and the size of the grains 1100 in the first polysilicon material is greater than a size of the grains 1300 in the third polysilicon material in the length direction of the channel region 100. As a result, under a premise of a same size of the channel region, the number of grain boundaries in the channel region 100 in the embodiments of the present disclosure is less than the number of the grain boundaries in the channel region in the related art. The less the grain boundaries, the higher the carrier mobility. Thus, the carrier mobility of the channel region 100 may be improved in the embodiments of the present disclosure.

In some embodiments, referring to FIGS. 8A to 8D, the thin film transistor 1 further includes an etch stop pattern 14 disposed on the top surface D2 of the first active pattern 11.

Referring to FIGS. 8A to 8D, in an example in which the shape of the first active pattern 11 is a rectangle, and the etch stop pattern 14 covers an upper side of the first active pattern 11.

An orthogonal projection of the first active pattern 11 on the substrate 2 is located within an orthogonal projection of the etch stop pattern 14 on the substrate 2, and the orthogonal projection of the etch stop pattern 14 on the substrate 2 is non-overlapping with orthogonal projection(s) of the second active pattern(s) 12 on the substrate 2.

The first active pattern 11 is in contact with the second active pattern(s) 12, and thus, in a case where a length of the etch stop pattern 14 is equal to a length of the first active pattern 11, and a width of the etch stop pattern 14 is greater than or equal to a width of the first active pattern 11, a border of the orthogonal projection of the first active pattern 11 on the substrate 2 may be located within a border of the orthogonal projection of the etch stop pattern 14 on the substrate 2, and the orthogonal projection of the etch stop pattern 14 on the substrate 2 is non-overlapping with the orthogonal projection(s) of the second active pattern(s) 12 on the substrate 2.

Figure 8A:
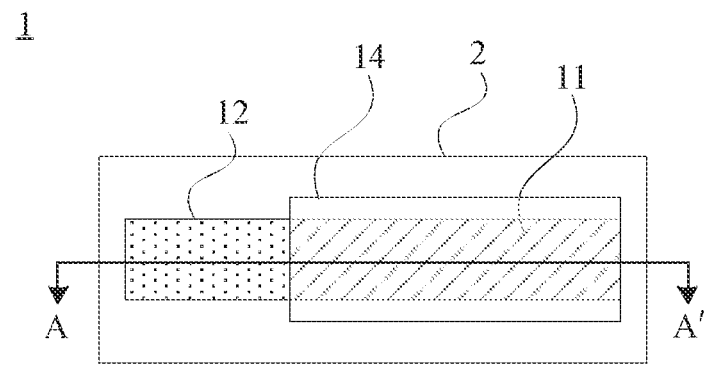
FIG. 8A is a top view of yet another thin film transistor, in accordance with some embodiments of the present disclosure.

For example, referring to FIG. 8A, which is a top view of the etch stop pattern 14, the first active pattern 11 and the second active pattern 12 in the thin film transistor 1. The length of the etch stop pattern 14 is equal to the length of the first active pattern 11, and the width of the etch stop pattern 14 is greater than the width of the first active pattern 11.

Figure 8B:
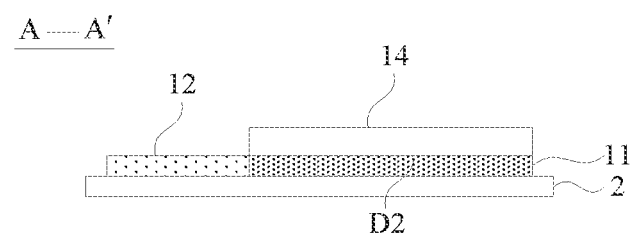
FIG. 8B is a longitudinal sectional view of FIG. 8A taken along the line A-A'.

On this basis, referring to FIG. 8B, which is a longitudinal sectional view of FIG. 8A taken along the line A-A', the length of the etch stop pattern 14 is equal to the length of the first active pattern 11, and the etch stop pattern 14 is located on a side of the first active pattern 11 away from the substrate 2.

Figure 8C:
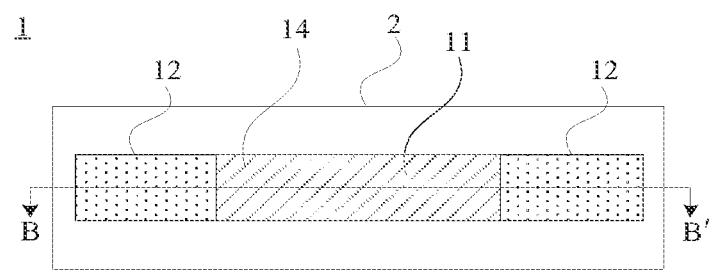
FIG. 8C is a top view of yet another thin film transistor, in accordance with some embodiments of the present disclosure.
Figure 8D:
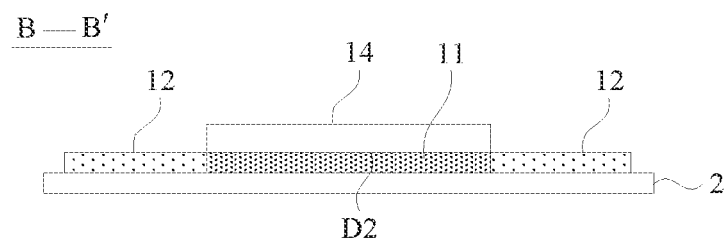
FIG. 8D is a longitudinal sectional view of FIG. 8C taken along the line B-B'.

For another example, FIG. 8C is a top view of the etch stop pattern 14, the first active pattern 11 and the second active patterns 12 in the thin film transistor 1, and FIG. 8D is a longitudinal sectional view of FIG. 8C taken along the line B-B'. The length of the etch stop pattern 14 is equal to the length of the first active pattern 11, and the width of the etch stop pattern 14 is equal to the width of the first active pattern 11.

It will be understood by those skilled in the art that, a width direction in the present disclosure may be understood as, for example, a direction perpendicular to the length direction L of the channel region 100.

For example, a thickness of the etch stop pattern 14 is 1000 Å to 3000 Å. A material of the etch stop pattern 14 is, for example, silicon oxide (SiOx).

Since the etch stop pattern 14 is located on the upper side of the first active pattern 11, when a first polysilicon film layer located on the top surface D2 is formed, the surface roughness of the first polysilicon film layer may be reduced due to gravity of the etch stop pattern 14. As a result, defects in the first polysilicon film layer are reduced, and the leakage current of the thin film transistor 1 is reduced.

In some embodiments, referring to FIGS. 2B, 2E and 2G, the at least one side surfaces includes the first side surface S1 and the second side surface S2 that are arranged opposite to each other in the length direction L of the channel region 100, and the second active pattern 12 is in contact with the first side surface S1 and the second side surface S2.

Referring to FIG. 2B, there is one first side surface S1 and one second side surface S2, and there are two second active patterns 12, one of which is in contact with the first side surface S1, and the other of which is in contact with the second side surface S2.

Referring to FIGS. 2E and 2G, there are a plurality of first side surfaces S1, (i.e., the first side surface $S1_{-1}$, the first side surface $S1_{-2}$ and the first side surface $S1_{-3}$); there are also a plurality of second side surfaces S2, (i.e., the second side surface $S2_{-1}$, the second side surface $S2_{-2}$ and the second side surface $S2_{-3}$). There are two second active patterns 12, one of which is in contact with the first side surface $S1_{-1}$, the first side surface $S1_{-2}$ and the first side surface $S1_{-3}$, and the other of which is in contact with the second side surface $S2_{-1}$, the second side surface $S2_{-2}$ and the second side surface $S2_{-3}$.

A maximum length of the grains 1100 in the first polysilicon material during growth is limited, and thus, in a case where the second active patterns 12 are in contact with both the first side surface(s) S1 and the second side surface(s) S2, the grains 1100 in the first polysilicon material may grow from two ends of the length direction of the first active pattern 11 towards the direction close to the center line of the length direction of first active pattern 11, which may ensure that the length of the grown grains 1100 in first polysilicon material is greater than the length of grains 1200 in the second polysilicon material, and may also reduce process difficulty of the grains 1100 in the first polysilicon material during growth, thereby reducing the difficulty of manufacturing the first active pattern 11.

In some embodiments, referring to FIGS. 9A to 9F, the active layer 10 further includes third active patterns 13. A material of the third active patterns 13 is, for example, amorphous silicon.

In the length direction of the channel region 100, the third active patterns 13 are disposed on opposite sides of an active pattern group 110. The active pattern group 110 includes the first active pattern 11 and the second active pattern(s) 12.

Figure 9A:
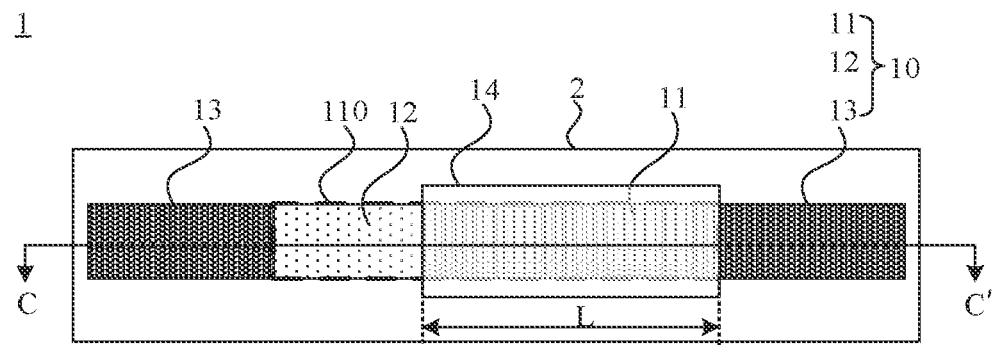
FIG. 9A is a top view of yet another thin film transistor, in accordance with some embodiments of the present disclosure.
Figure 9B:
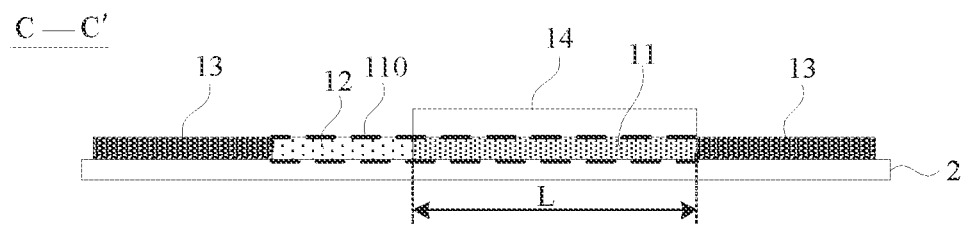
FIG. 9B is a longitudinal sectional view of FIG. 9A taken along the line C-C'.

Referring to FIGS. 9A and 9B, FIG. 9A is a top view of the thin film transistor 1, there are two third active patterns 13, and the active pattern group 110 includes one second active pattern 12 and one first active pattern 11. In the length direction L of the channel region 100, two third active patterns 13 are located on opposite sides of the active pattern group 110, one of which is in contact with the second active pattern 12, and the other of which is in contact with the first active pattern 11.

Figure 9C:
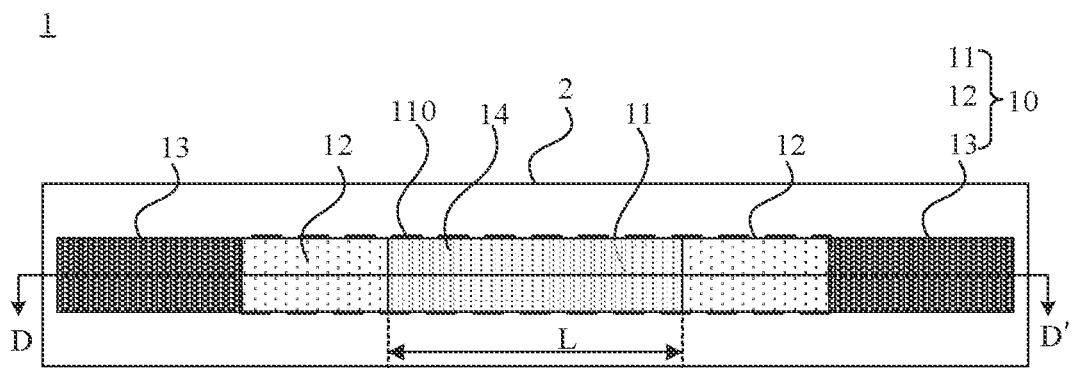
FIG. 9C is a top view of yet another thin film transistor, in accordance with some embodiments of the present disclosure.
Figure 9D:
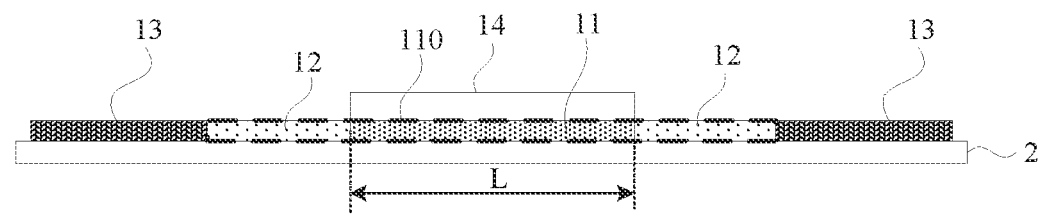
FIG. 9D is a longitudinal sectional view of FIG. 9C taken along the line D-D'.

Referring to FIGS. 9C and 9D, FIG. 9C is a top view of the thin film transistor 1, there are two third active patterns 13, and the active pattern group 110 includes one first active pattern 11 and two second active patterns 12. In the length direction L of the channel region 100, the third active patterns 13 are disposed on opposite sides of the active pattern group 110, and each third active pattern 13 is in contact with the second active pattern 12.

Figure 9E:
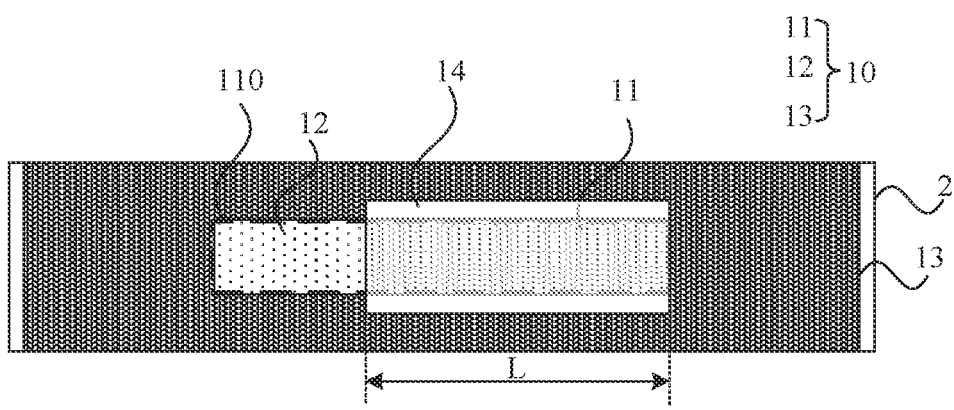
FIG. 9E is a top view of yet another thin film transistor, in accordance with some embodiments of the present disclosure.
Figure 9F:
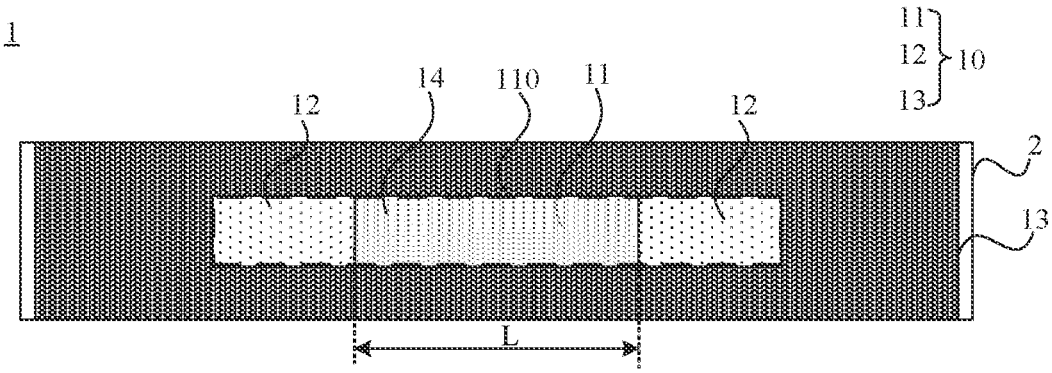
FIG. 9F is a top view of yet another thin film transistor, in accordance with some embodiments of the present disclosure.

In some other embodiments, referring to FIGS. 9E and 9F, which are both top views of the thin film transistor 1, the third active pattern 13 is arranged around the active pattern group 110, and the active pattern group 110 includes the first active pattern 11 and the second active pattern(s) 12. In a case where the third active pattern 13 is arranged around the active pattern group 110, it is convenient to manufacture the third active pattern 13, and an area of the third active pattern 13 is relatively large, which may further reduce the leakage current of the thin film transistor 1.

In some embodiments, referring to FIGS. 8C, 9C and 9F, the border of the orthogonal projection of the first active pattern 11 on the substrate 2 coincides or substantially coincides with the border of the orthogonal projection of the etch stop pattern 14 on the substrate 2. In this structure, a size of the first active pattern 11 and a size of the etch stop pattern 14 are the same or approximately the same, so that the first active pattern 11 and the etch stop pattern 14 may be obtained through a same patterning process during manufacturing, thus the manufacture process and manufacture difficulty of the first active pattern 11 and the etch stop pattern 14 may be simplified. The patterning process includes processes such as film formation, exposure, development and etching.

In some embodiments, referring to FIGS. 10A to 10I, the thin film transistor 1 further includes ohmic contact pattern(s) 15 disposed on a side of the active layer 10 away from the substrate 2, and the ohmic contact pattern(s) 15 are in contact with the active layer 10.

The ohmic contact pattern(s) 15 are used for generating an ohmic contact between the source 111 and the drain 112. A material of the ohmic contact pattern(s) 15 is, for example, N+ a-si, and a thickness thereof is, for example, 430 Å to 500 Å. For example, a width of the ohmic contact pattern 15 may be greater than a width of the active layer 10, or may be less than or equal to the width of the active layer 10, both of which may achieve electrical connection between the ohmic contact pattern 15 and the active layer 10. Therefore, the width of the ohmic contact pattern 15 is not limited in the embodiments of the present disclosure.

Figure 10A:
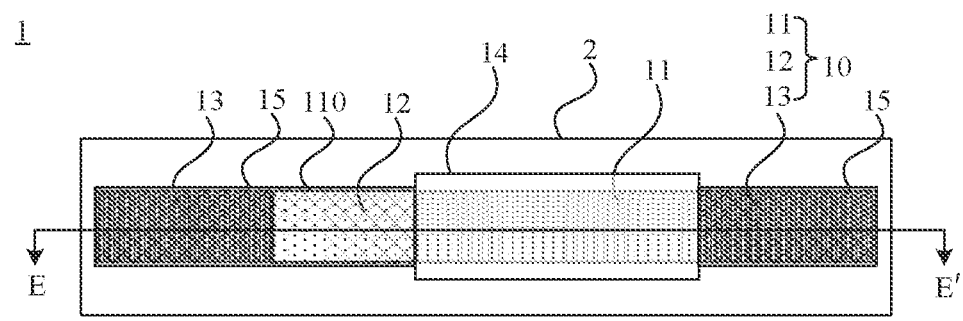
FIG. 10A is a top view of yet another thin film transistor, in accordance with some embodiments of the present disclosure.
Figure 10B:
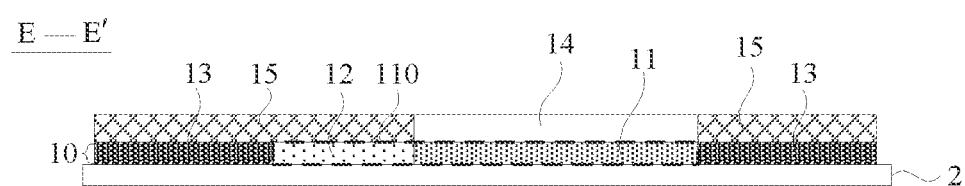
FIG. 10B is a longitudinal sectional view of FIG. 10A taken along the line E-E'.

Referring to FIGS. 10A and 10B, FIG. 10A is a top view of the thin film transistor 1, the ohmic contact patterns 15 are located on a side of the third active patterns 13 away from the substrate 2. One ohmic contact pattern 15 is in contact with the second active pattern 12 and one third active pattern 13, and the other ohmic contact pattern 15 is in contact with the other third active pattern 13.

Figure 10C:
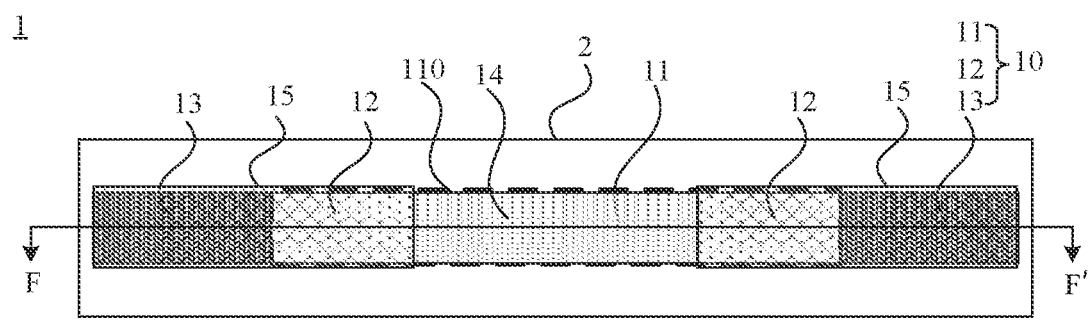
FIG. 10C is a top view of yet another thin film transistor, in accordance with some embodiments of the present disclosure.
Figure 10D:
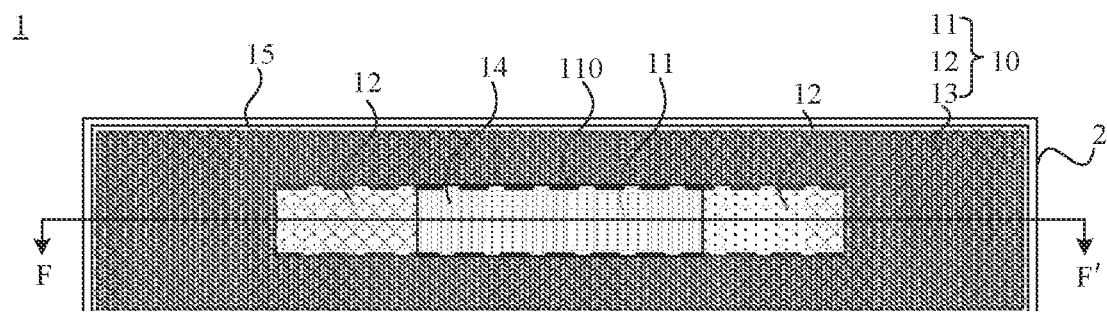
FIG. 10D is a top view of yet another thin film transistor, in accordance with some embodiments of the present disclosure.
Figure 10E:
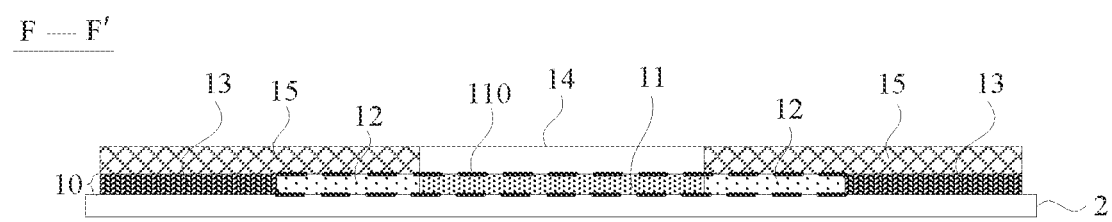
FIG. 10E is a longitudinal sectional view of FIG. 10C or FIG. 10D taken along the line F-F'.

Referring to FIGS. 10C to 10E, FIGS. 10C and 10D are top views of the thin film transistor 1, the ohmic contact pattern(s) 15 are located on a side, away from the substrate 2, of both the second active patterns 12 and the third active pattern(s) 13 away from the substrate 2, and are in contact with the second active patterns 12 and the third active pattern(s) 13.

Figure 10F:
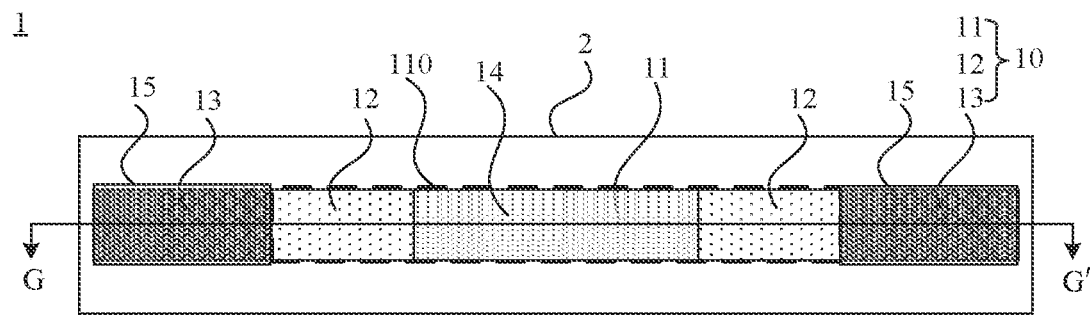
FIG. 10F is a top view of yet another thin film transistor, in accordance with some embodiments of the present disclosure.
Figure 10G:
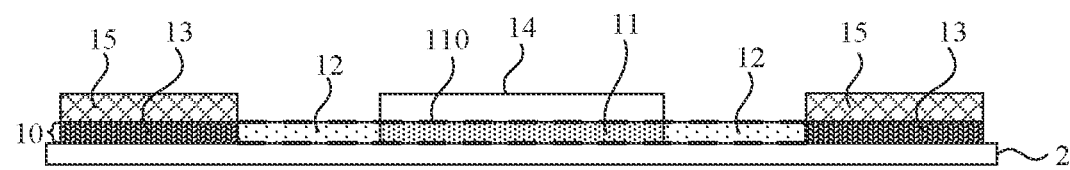
FIG. 10G is a longitudinal sectional view of FIG. 10F taken along the line G-G'.

Referring to FIGS. 10F and 10G, FIG. 10F is a top view of the thin film transistor 1, the ohmic contact patterns 15 are located on the sides of the third active patterns 13 away from the substrate 2, and are only in contact with the third active patterns 13.

Figure 10H:
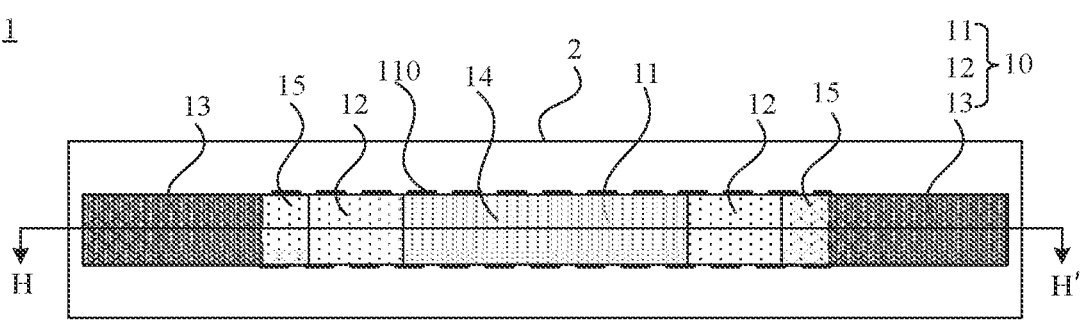
FIG. 10H is a top view of yet another thin film transistor, in accordance with some embodiments of the present disclosure.
Figure 10I:
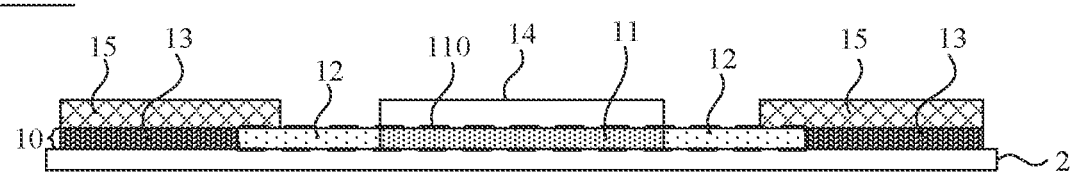
FIG. 10I is a longitudinal sectional view of FIG. 10H taken along the line H-H'.

Referring to FIGS. 10H and 10I, FIG. 10H is a top view of the thin film transistor 1, the ohmic contact patterns 15 are located on a side, away from the substrate 2, of both the second active patterns 12 and the third active patterns 13, and are each in contact with part of the respective second active pattern 12 and the respective third active pattern 13, and there is a gap between each ohmic contact pattern 15 and the etch stop pattern 14.

The various ohmic contact patterns 15 described above have simple structures, and may all electrically connected to the active layer 10. After the source 111 and the drain 112 are subsequently manufactured on the ohmic contact pattern 15, the source 111 and the drain 112 may electrically connected to the active layer 10 through the ohmic contact pattern(s) 15.

Figure 11A:
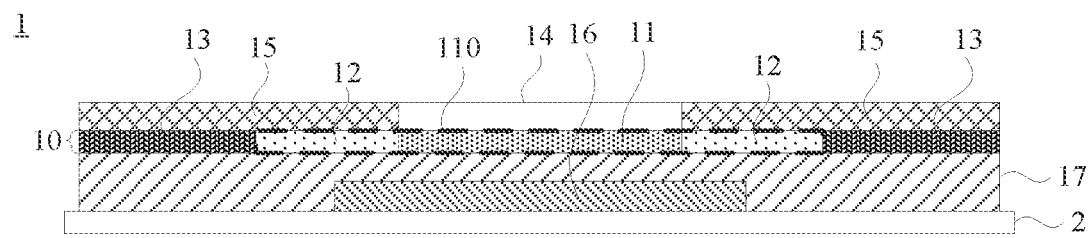
FIGS. 11A to 11E are longitudinal sectional structural views of other thin film transistors, in accordance with some embodiments of the present disclosure.

In some embodiments, referring to FIG. 11A, the thin film transistor 1 further includes a gate 16 disposed on a side of the active layer 10 proximate to the substrate 2.

Figure 11B:
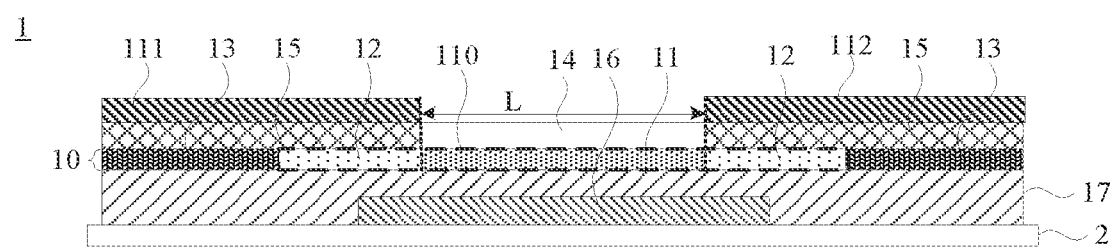

Referring to FIGS. 11A and 11B, which are longitudinal sectional views of the thin film transistor 1, the gate 16 is disposed on the substrate 2, and a gate insulating layer 17 is provided between the gate 16 and the active layer 10. The gate insulating layer 17 is used for insulating the gate 16 from the active layer 10. A material of the gate insulating layer 17 is, for example, silicon oxide (SiO) and/or silicon nitride (SiN).

In some other embodiments, the gate insulating layer 17 is a two-layer structure. A layer of the two-layer structure proximate to the gate 16 is a silicon nitride layer, and a thickness of the silicon nitride layer is, for example, 500 Å to 3000 Å, and another layer of the two-layer structure proximate to the active layer 10 is a silicon oxide layer, and a thickness of the silicon oxide layer is, for example, 1000 Å to 3000 Å.

Referring to FIG. 11B, in a case where the gate 16 is disposed on the side of the active layer 10 proximate to the substrate 2, the thin film transistor 1 is a bottom-gate structure, and the source 111 and the drain 112 may be directly disposed on the sides, away from the substrate 2, of the ohmic contact patterns 15. The source 111 is electrically connected to the active layer 10 through an ohmic contact pattern 15, and the drain 112 is electrically connected to the active layer 10 through another ohmic contact pattern 15. A portion of the active layer 10 between the source 111 and the drain 112 is the channel region 100, and the length of the channel region is, for example, L.

Figure 11C:
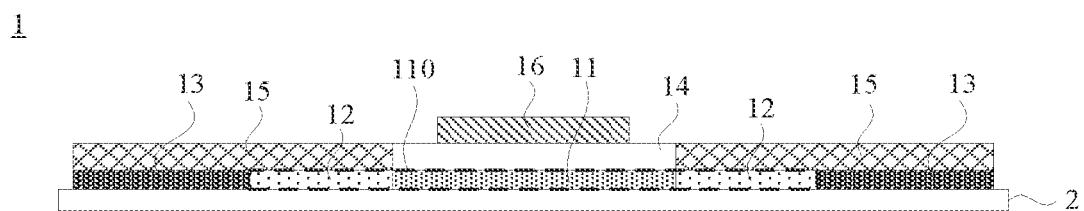
Figure 11D:
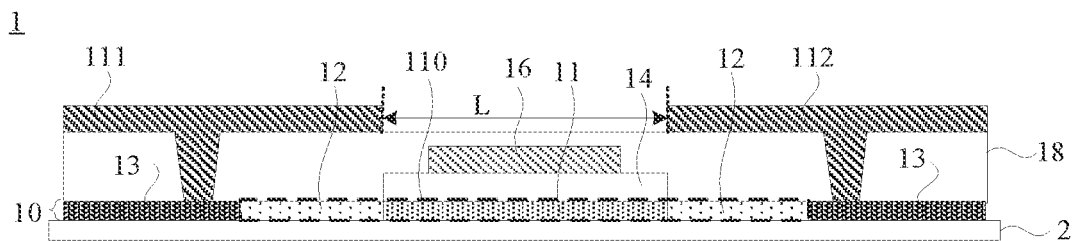
Figure 11E:
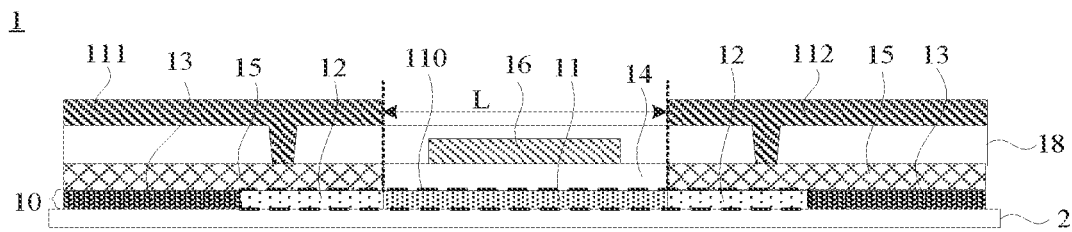

In some other embodiments, referring to FIGS. 11C to 11E, which are longitudinal sectional views of the thin film transistor 1, the gate 16 is disposed on the side of the active layer 10 away from the substrate 2.

For example, referring to FIGS. 11C to 11E, the gate 16 is disposed on a side of the etch stop pattern 14 away from the substrate 2, and the etch stop pattern 14 insulates the active layer 10 from the gate 16.

Referring to FIGS. 11D and 11E, in a case where the gate 16 is disposed on the side of the active layer 10 away from the substrate 2, the thin film transistor 1 is a top-gate structure. In this structure, an interlayer insulating layer 18 is provided on a side of the gate 16 away from the substrate 2; the source 111 and the drain 112 are disposed on a side of the interlayer insulating layer 18 away from the substrate 2, and are electrically connected to the active layer 10 through via holes in the interlayer insulating layer 18.

In some embodiments, the second active pattern(s) 12 and the third active patterns 13 are doped with N+ ions, and a doping concentration of N+ ions in the third active patterns 13 is greater than a doping concentration of N+ ions in the second active pattern(s) 12. In this case, the third active patterns 13 may be referred to as heavily doped patterns, and the second active pattern(s) 12 may be referred to as lightly doped pattern(s). The source 111 is electrically connected to one third active pattern 13 through one via hole in the interlayer insulating layer 18, and the drain 112 is electrically connected to another third active pattern 13 through the other via hole in the interlayer insulating layer 18.

In some other embodiments, referring to FIG. 11E, the source 111 is in contact with an ohmic contact pattern 15 through a via hole in the interlayer insulating layer 18, and the drain 112 is in contact with another ohmic contact pattern 15 through another via hole in the interlayer insulating layer 18.

A region of the active layer 10 located between the source 111 and the drain 112 is the channel region 100, and the length of the channel region is, for example, L.

It will be noted that, in the embodiments of the present disclosure, the reference sign L not only represents the length of the channel region 100 but also the length direction of the channel region 100.

A material of the gate 16 in the above bottom-gate thin film transistor and top-gate thin film transistor is, for example, molybdenum (Mo), and a thicknesses thereof is, for example, 2200 Å.

No matter the thin film transistor 1 in the present disclosure is a bottom-gate structure or a top-gate structure, carriers in the channel region 100 thereof have a high mobility.

Figure 12A:
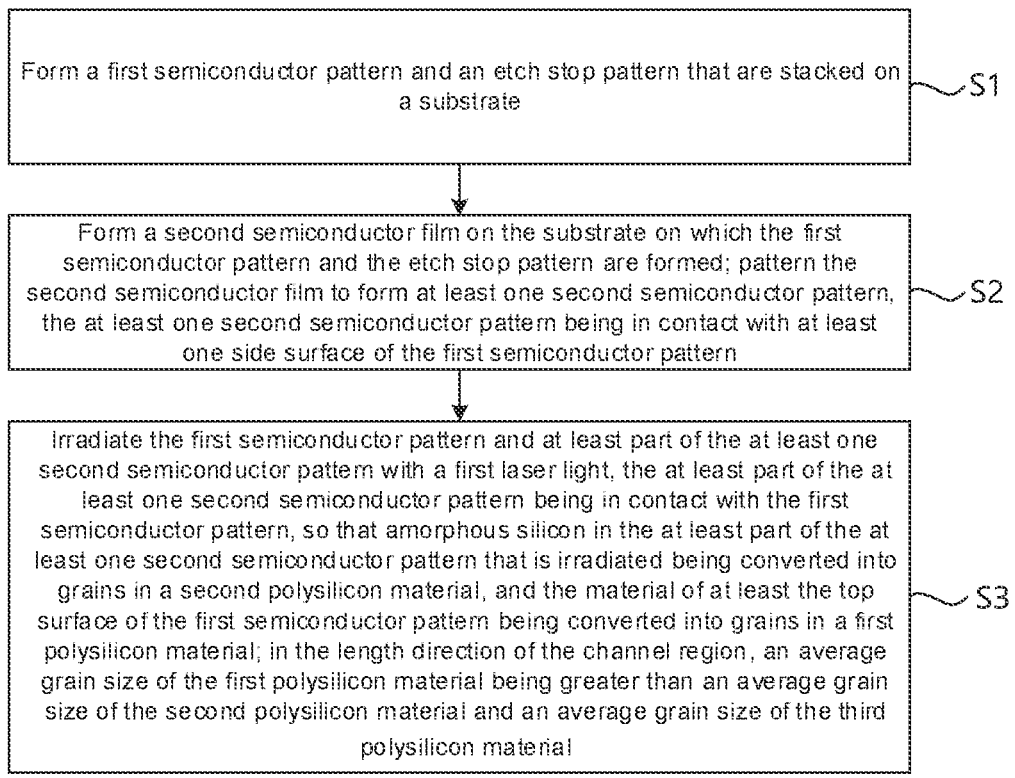
FIG. 12A is a flow diagram of a manufacturing method for a thin film transistor, in accordance with some embodiments of the present disclosure.

Referring to FIG. 12A, some embodiments of the present disclosure provide a manufacturing method for a thin film transistor 1. The method includes following steps (S1 to S3).

Figure 12B:
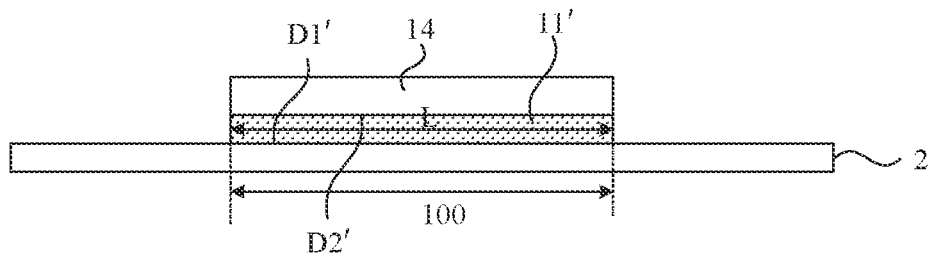
FIG. 12B is a longitudinal sectional view of a thin film transistor in a manufacturing process, in accordance with some embodiments of the present disclosure.

In S1, referring to FIG. 12B, a first semiconductor pattern 11' and an etch stop pattern 14 that are stacked are formed on a substrate 2.

At least part of the first semiconductor pattern 11' is used for forming a channel region 100, and a length and a length direction of the channel region 100 are, for example, L. The first semiconductor pattern 11' includes a bottom surface D1', a top surface D2' and at least one side surface. The bottom surface D1' and the top surface D2' are arranged opposite to each other in a thickness direction of the substrate 2, and the bottom surface D1' is further close to the substrate 2. The at least one side surface connects the bottom surface D1' and the top surface D2'. A length direction of each side surface of the at least one side surface is perpendicular or approximately perpendicular to the length direction L of the channel region 100. An orthogonal projection of the first semiconductor pattern 11' on the substrate 2 is located within an orthogonal projection of the etch stop pattern 14 on the substrate 2.

Figure 12C:
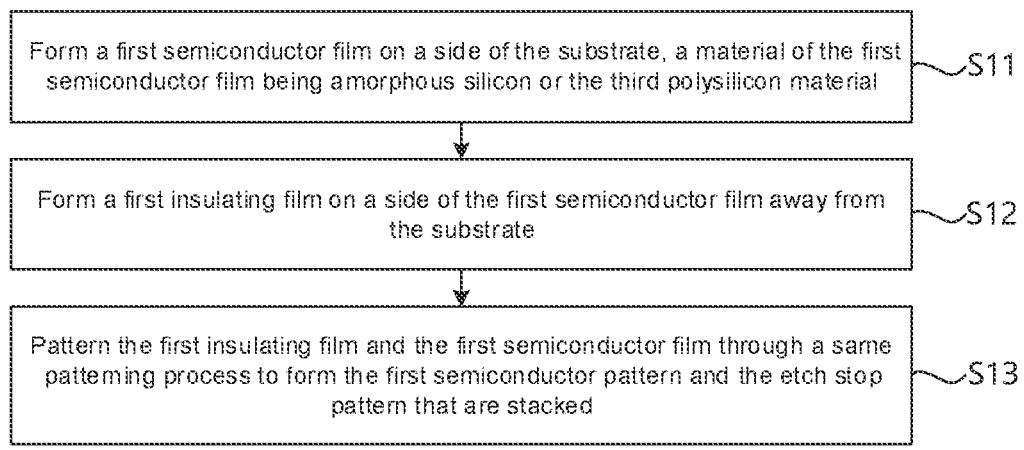
FIG. 12C is a flow diagram of a manufacturing method for another thin film transistor, in accordance with some embodiments of the present disclosure.

In some embodiments, referring to FIG. 12C, forming the first semiconductor pattern 11' and the etch stop pattern 14 that are stacked on the substrate 2 includes following steps (S11 to S13).

Figure 12D:
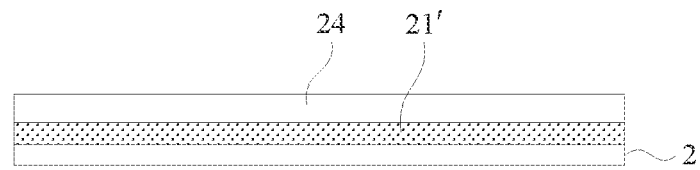
FIG. 12D is a longitudinal sectional view of another thin film transistor in a manufacturing process, in accordance with some embodiments of the present disclosure.

In S11, referring to FIG. 12D, a first semiconductor film 21' is formed on a side of the substrate 2, and a material of the first semiconductor film 21' is amorphous silicon or the third polysilicon material.

A thickness of the first semiconductor film 21' is, for example, 430 Å to 500 Å.

In S12, referring to FIG. 12D, a first insulating film 24 is formed on a side of the first semiconductor film 21' away from the substrate 2.

A thickness of the first insulating film 24 is, for example, 1000 Å to 3000 Å, and a material of the first insulating film 24 is, for example, silicon oxide.

In S13, referring to FIG. 12B, the first semiconductor film 21' and the first insulating film 24 are patterned through a same patterning process, so as to form the first semiconductor pattern 11' and the etch stop pattern 14 that are stacked.

In a case where the first semiconductor film 21' and the first insulating film 24 are patterned through a same patterning process, the first insulating film 24 is etched through a dry etching process firstly to form the etch stop pattern 14, and the gas for etching the first insulating film 24 is, for example, chlorine-containing or fluorine-containing gas, such as tetrafluoromethane ($CF_4$); and then, the first semiconductor film 21' is etched through a dry etching process to form the first semiconductor pattern 11', and the gas for etching the first semiconductor film 21' is, for example, chlorine ($Cl_2$).

Figure 12E:
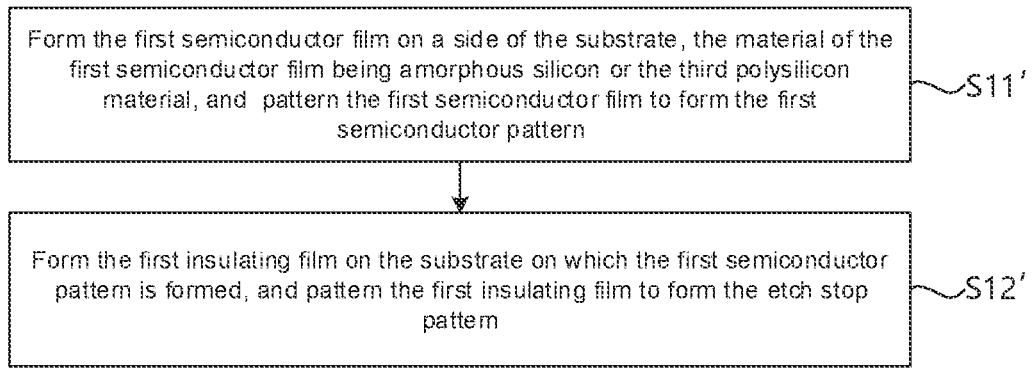
FIG. 12E is a flow diagram of a manufacturing method for yet another thin film transistor, in accordance with some embodiments of the present disclosure.

In some other embodiments, referring to FIG. 12E, forming the first semiconductor pattern 11' and the etch stop pattern 14 that are stacked on the substrate 2 includes S11' and S12'.

Figure 12F:
FIGS. 12F to 12H are longitudinal sectional views of another thin film transistor in a manufacturing process, in accordance with some embodiments of the present disclosure.

In S11', referring to FIG. 12F, a first semiconductor film 21' is formed on a side of the substrate 2, a material of the first semiconductor film 21' is amorphous silicon or the third polysilicon material, and the first semiconductor film 21' is patterned to form the first semiconductor pattern 11'.

A thickness of the formed first semiconductor film 21' is, for example, 430 Å to 500 Å, and a gas for etching the first semiconductor film 21' is, for example, chlorine ($Cl_2$).

Figure 12G:
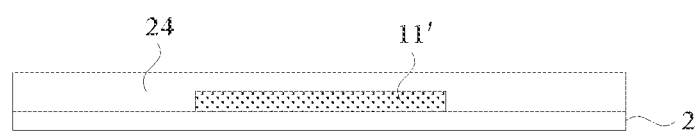

In S12', referring to FIGS. 12G and 12B, a first insulating film 24 is formed on the substrate 2 on which the first semiconductor pattern 11' is formed, and the first insulating film 24 is patterned to form the etch stop pattern 14.

A thickness of the formed first insulating film 24 is, for example, 1000 Å to 3000 Å. A material of the first insulating film 24 is, for example, silicon oxide, and a gas for etching the first insulating film 24 is, for example, $CF_4$.

In a case where the material of the first semiconductor film 21' is amorphous silicon, the material of the first semiconductor pattern 11' is amorphous silicon; in a case where the material of the first semiconductor film 21' is the third polysilicon 1300, the material of the first semiconductor pattern 11' is the third polysilicon material. That is, the material of the first semiconductor pattern 11' is amorphous silicon or the third polysilicon material.

Figure 12H:
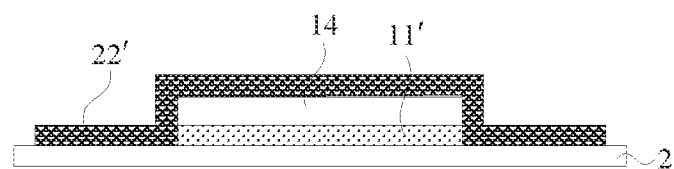
Figure 12I:
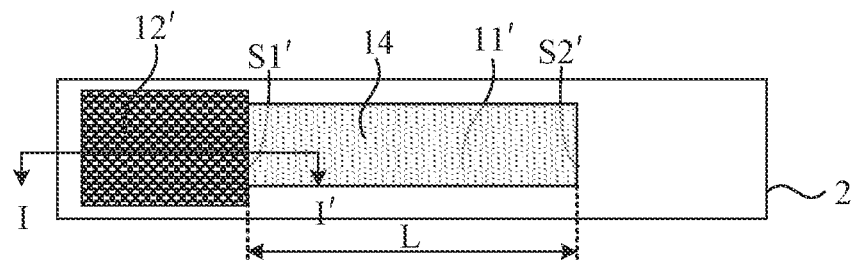
FIG. 12I is a top structural view of yet another thin film transistor in a manufacturing process, in accordance with some embodiments of the present disclosure.
Figure 12J:
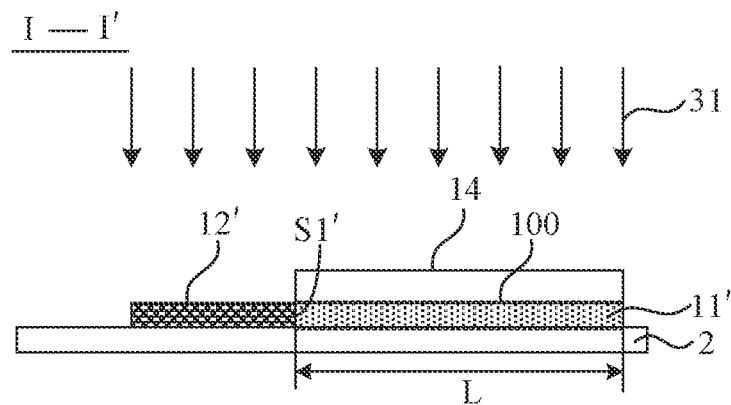
FIG. 12J is a longitudinal sectional view of FIG. 12I taken along the line I-I'.

In S2, referring to FIGS. 12H to 12J, a second semiconductor film 22' is formed on the substrate 2 on which the first semiconductor pattern 11' and the etch stop pattern 14 are formed, and the second semiconductor film 22' is patterned to form second semiconductor pattern(s) 12'; the second semiconductor pattern(s) 12' are in contact with at least one side surface of the first semiconductor pattern 11'.

Referring to FIG. 12H, the second semiconductor film 22' is in contact with the etch stop pattern 14 and the first semiconductor pattern 11', and a material of the second semiconductor film 22' is amorphous silicon. That is, the second semiconductor film 22' entirely covers the substrate 2.

It will be understood by those skilled in the art that, the second semiconductor film 22' is manufactured in a whole layer, and covers film layers located thereunder. For example, in a case where there are other film layer(s) on the substrate 2, such as a buffer layer, the second semiconductor film 22' covers the buffer layer. In this case, the second semiconductor film 22' is not in direct contact with the substrate 2. A material of the buffer layer is, for example, at least one of silicon oxide and silicon nitride.

Referring to FIGS. 12I and 12J, FIG. 12I is a top view of the first semiconductor pattern 11' and the second semiconductor pattern 12' in the thin film transistor 1, the second semiconductor pattern 12' is in contact with a side surface of the first semiconductor pattern 11', and the side surface is, for example, a first side surface S1' whose length direction is perpendicular to the length direction L of the channel region 100.

Figure 12K:
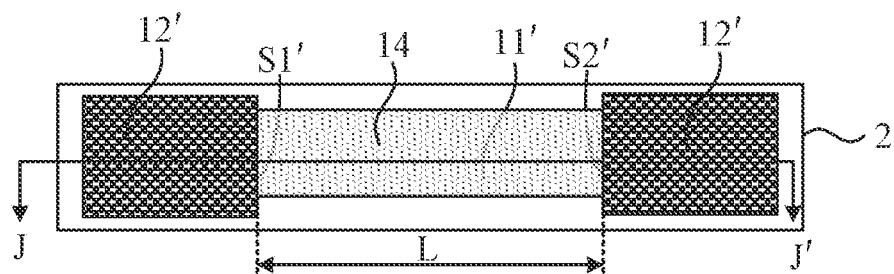
FIGS. 12K and 12L are top structural views of yet another thin film transistor in a manufacturing process, in accordance with some embodiments of the present disclosure.
Figure 12L:
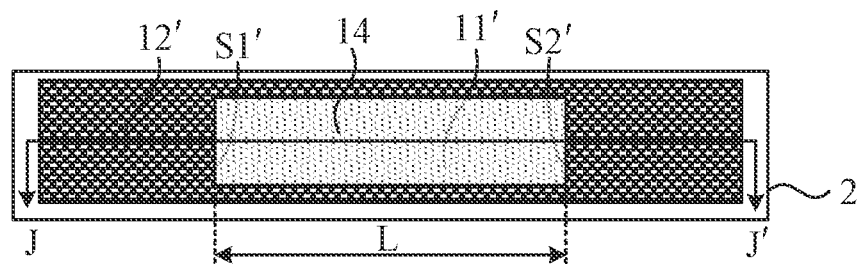
Figure 12M:
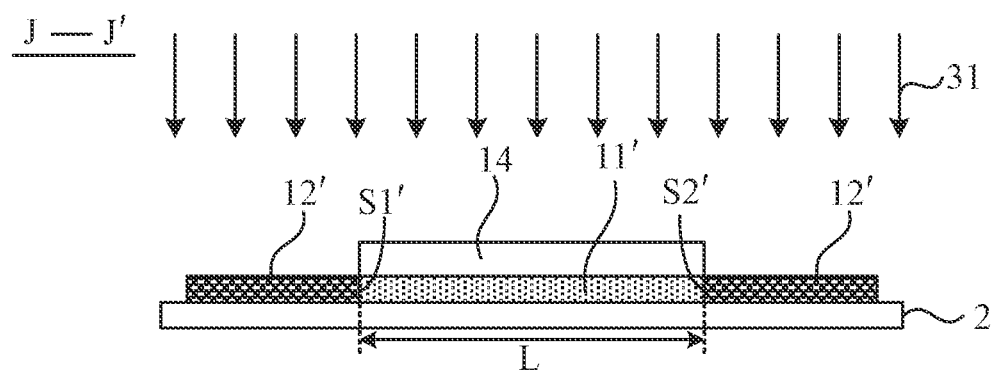
FIG. 12M is a longitudinal sectional view of FIG. 12K or 12L taken along the line J-J'.

Referring to FIGS. 12K and 12M, FIG. 12K is atop view of the first semiconductor pattern 11' and the second semiconductor patterns 12' in the thin film transistor 1, the second semiconductor patterns 12' are in contact with two side surfaces of the first semiconductor pattern 11', and the two side surfaces are, for example, a first side surface S1 and a second side surface S2' whose length directions are perpendicular to the length direction L of the channel region 100.

Referring to FIGS. 12L and 12M, FIG. 12L is atop view of the first semiconductor pattern 11' and the second semiconductor pattern 12' in the thin film transistor 1, the second semiconductor pattern 12' is arranged around the first semiconductor pattern 11'.

In S3, the first semiconductor pattern 11' and at least part of the second semiconductor pattern(s) 12' are irradiated with a first laser light 31, and the at least part of the second semiconductor pattern 12' is in contact with the first semiconductor pattern 11', so that amorphous silicon in the material of the at least part of the second semiconductor pattern 12' that is irradiated is converted into polysilicon grains 1200 in a second polysilicon material, and the material of at least the top surface D2' of the first semiconductor pattern 11' is converted into polysilicon grains 1100 in the first polysilicon material. In the length direction L of the channel region 100, the average grain size of the first polysilicon material is greater than the average grain size of the second polysilicon material and the average grain size of the third polysilicon material.

For example, in conjunction with FIGS. 12I, 12J and 8B, the first semiconductor pattern 11' and the entire second semiconductor pattern 12' are irradiated with the first laser light 31, so that the first semiconductor pattern 11' is converted into a first active pattern 11, and the second semiconductor pattern 12' is converted into a second active pattern 12.

For example, in conjunction with FIGS. 12K, 12M and 8D, the first semiconductor pattern 11' and all of the second semiconductor patterns 12' are irradiated with the first laser light 31, so that the first semiconductor pattern 11' is converted into the first active pattern 11, and the two second semiconductor patterns 12' are converted into two second active patterns 12.

After the entire second semiconductor patterns 12' is irradiated with the first laser light 31 to form the second active patterns 12, when manufacturing third active patterns 13, it is necessary to manufacture an amorphous silicon film on the substrate 2 on which the second active pattern 12 is manufactured, and then the third active patterns 13 are formed by the amorphous silicon film through a patterning process. A material of the third active pattern is a-si.

Figure 12N:
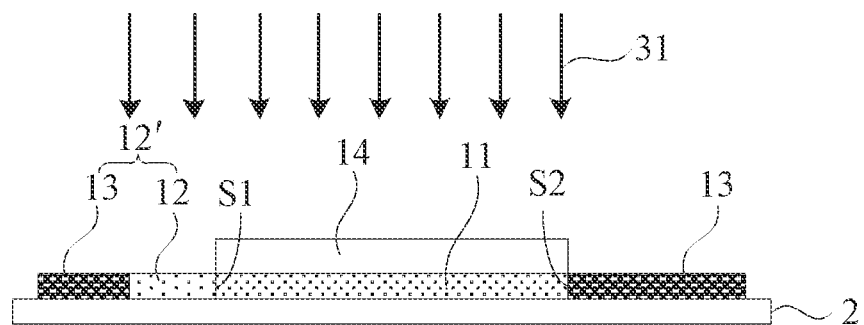
FIGS. 12N and 12O are longitudinal sectional views of other thin film transistors in a manufacturing process, in accordance with some embodiments of the present disclosure.
Figure 12O:
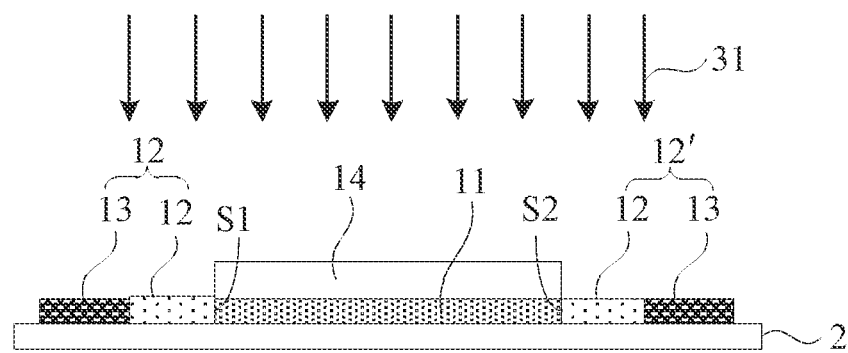

In conjunction with FIGS. 12K, 12L and 12N, or in conjunction with FIGS. 12K, 12L and 12O, the first semiconductor pattern 11' and part(s) of the second semiconductor pattern(s) 12' are irradiated with the first laser light 31, so that the first semiconductor pattern 11' is converted into the first active pattern 11, and the part of the second semiconductor pattern(s) 12' that is irradiated with the first laser light 31 into the second active pattern 12. The material of the second active pattern(s) 12 is the second polysilicon material. Since the material of a remaining part(s) of the second semiconductor pattern(s) 12' that is not irradiated with the first laser light 31 is amorphous silicon, the remaining part(s) of the second semiconductor pattern(s) 12' that are not irradiated with the first laser light 31 may be used for forming the third active pattern 13. Therefore, the second active pattern(s) 12 and the third active pattern(s) 13 may be simultaneously manufactured through the second semiconductor pattern(s) 12', thus the manufacturing process is simple. When the part(s) of the second semiconductor pattern(s) 12' are irradiated with the first laser light 31, the part(s) of the second semiconductor pattern(s) 12' that are irradiated with the first laser light 31 must be in contact with the first semiconductor pattern 11', so that the first semiconductor pattern 11' is able to be converted into the first active pattern 11.

In the process of converting the first semiconductor pattern 11' into the first active pattern 11 and converting at least part of the second semiconductor pattern 12' into the second active pattern 12, in a case where the material of the first semiconductor pattern 11' is amorphous silicon, after the first semiconductor pattern 11' and the second semiconductor pattern(s) 12' are irradiated with the first laser light 31, amorphous silicon in the first semiconductor pattern 11' and the second semiconductor pattern(s) 12' melts simultaneously. During cooling, due to the heat preservation effect of the etch stop pattern 14 on the first semiconductor pattern 11', the molten amorphous silicon in the second semiconductor pattern(s) 12' is crystallized earlier than the molten amorphous silicon in the first semiconductor pattern 11', so that crystal nucleuses are formed on at least one side surface proximate to the first semiconductor pattern 11'. For example, referring to FIG. 12J, amorphous silicon in the second semiconductor pattern 12' form crystal nucleuses on the first side surface S1 proximate to the first semiconductor pattern 11', and the molten amorphous silicon in the first semiconductor pattern 11' may laterally grow into the grains 1100 in the first polysilicon material in the length direction of the first semiconductor pattern 11' due to the guidance of the crystal nucleuses.

In a case where the material of the first semiconductor pattern 11' is the third polysilicon material, after the first semiconductor pattern 11' and the at least part of second semiconductor pattern(s) 12' are irradiated with the first laser light 31, since an absorptivity of the grains 1300 in the third polysilicon material for the first laser light 31 is lower than an absorptivity of amorphous silicon for the first laser light 31, only the third polysilicon material on the top surface D2' of the first semiconductor pattern 11' may melt when amorphous silicon in the at least part of second semiconductor pattern(s) 12' completely melts. Thus, during cooling, due to the heat preservation effect of the etch stop pattern 14 on the semiconductor pattern 11', the molten amorphous silicon in the at least part of second semiconductor pattern(s) 12' is crystallized earlier than the molten grains 1300 in the third polysilicon material in the first semiconductor pattern 11', so that crystal nucleuses are formed on at least one side surface proximate to the first semiconductor pattern 11'. For example, referring to FIG. 12J, the amorphous silicon in the second semiconductor pattern 12' form crystal nucleuses on the first side surface S1' proximate to the first semiconductor pattern 11', and the molten grains 1300 in the third polysilicon material in the first semiconductor pattern 11' may laterally grow into the grains 1100 in the first polysilicon 1100 in the length direction of the first semiconductor pattern 11' due to the guidance of the crystal nucleuses.

In the above process, for example, the first semiconductor pattern 11' and at least part of the second semiconductor pattern(s) 12' are irradiated regionally through the MLA technology, so that the first semiconductor pattern 11' is converted into the first active pattern 11 and the at least part of the second semiconductor pattern(s) 12' is converted into the second active pattern 12. In the MLA technology, for example, the first semiconductor pattern 11' and the at least part of the second semiconductor pattern(s) 12' are irradiated with the first laser light 31 that having an energy density of 300 mJ/cm$^2$ to 400 mJ/cm$^2$, a frequency of 100 Hz to 300 Hz and a shot number of 5 to 40.

It will be noted that, in the ELA technology, the laser light irradiates the entire film layer (for example, the film layer is an amorphous silicon film), while in the MLA technology, the laser light irradiates partial region of a film layer (a mask may be used to achieve irradiation of the partial region).

Therefore, the laser light irradiation in the MLA technology may also be referred to as regional irradiation, which is distinguished from the laser irradiation in the ELA technology.

In some embodiments, the manufacturing method for the thin film transistor 1 further includes:

referring to FIGS. 10A to 10I, forming ohmic contact pattern(s) 15 on the side of the active layer 10 away from the substrate 2; the ohmic contact pattern(s) 15 being in contact with the active layer 10.

A material of the ohmic contact pattern 15 is, for example, N+a-si, and the thickness thereof is, for example, 430 Å to 500 Å. The ohmic contact pattern(s) 15 are formed by, for example, forming an ohmic contact film first, and then patterning the ohmic contact film. A gas for etching the ohmic contact film is, for example, chlorine.

The material of N+a-si may be directly deposited on the active layer 10 to form the ohmic contact film. Alternatively, an amorphous silicon film may be formed first, and then the amorphous silicon film may be doped with N+ particles to form the ohmic contact film.

In some embodiments, the manufacturing method for the thin film transistor 1 further includes:

referring to FIGS. 11B and 11E, forming a source 111 and a drain 112 on the side of the ohmic contact pattern(s) 15 away from the substrate 2; the source 111 and the drain 112 being electrically connected to the active layer 10 through the ohmic contact pattern(s) 15.

A material of the source 111 and the drain 112 is, for example, conductive metals such as molybdenum (Mo), silver (Ag) and aluminum (Al).

In some embodiments, before forming the first semiconductor film 21', the manufacturing method for the thin film transistor 1 further includes:

referring to FIGS. 11A and 11B, forming a gate metal film on the side of the substrate 2, and patterning the gate metal film to form a gate 16. The thin film transistor 1 formed by the manufacturing method is a bottom-gate thin film transistor 1.

In some other embodiments, the manufacturing method for the thin film transistor 1 further includes:

referring to FIGS. 11C, 11D and 11E, forming a gate metal film on a side of the etch stop pattern 14 away from the substrate 2, and patterning the gate metal film to form a gate 16. The thin film transistor 1 formed by the manufacturing method is a top-gate thin film transistor 1.

A material of the gate metal film is, for example, Mo, and a thickness thereof is, for example, 2200 Å.

In some other embodiments, referring to FIG. 11D, the manufacturing method for the thin film transistor 1 includes:

forming an interlayer insulating layer 18 on a side of the gate 16 away from the substrate 2, and forming a source 111 and a drain 112 on a side of the interlayer insulating layer 18 away from the substrate. The source 111 is in contact with a third active pattern 13 through a via hole in the interlayer insulating layer 18, and the drain 112 is in contact with another third active pattern 13 through another via hole in the interlayer insulating layer 18. The second active pattern(s) 12 and the third active patterns 13 are both doped with N+ ions, and a doping concentration of the third active patterns 13 is greater than a doping concentration of the second active pattern(s) 12.

In some embodiments, forming the first semiconductor film 21' on the side of the substrate 2 includes:

forming an amorphous silicon film on the substrate; and irradiating the amorphous silicon film with a second laser light, so that amorphous silicon in the amorphous silicon film is converted into the grains 1300 in the third polysilicon material to form the first semiconductor film 21'. A material of the first semiconductor film 21' is the third polysilicon material.

For example, amorphous silicon in the entire amorphous silicon film may be converted into the grains 1300 in the third polysilicon material through the ELA technology, so as to form the first semiconductor film 21' made of the third polysilicon material, thereby obtaining the first semiconductor pattern 11' made of the third polysilicon material. The energy density of the second laser light used in the ELA technology is, for example, 300 mJ/cm$^2$ to 400 mJ/cm$^2$, and the frequency of the second laser light is, for example, 100 HZ to 300 HZ. Therefore, in the embodiments of the present disclosure, parameters of the first laser light 31 and parameters of the second laser light 32 are not exactly the same, and for the first laser light 31, the regional laser annealing process is performed, and for the second laser light, the excimer laser annealing process is performed.

In some other embodiments, a third polysilicon material may be directly deposited on the substrate 2 to form the first semiconductor film 21'. For example, the first semiconductor film 21' is formed by depositing the third polysilicon material through a physical vapor deposition (PVD) process.

In some embodiments, referring to FIGS. 2A to 2G, the manufacturing method for the thin film transistor 1 further includes:

removing the etch stop pattern 14. For example, the etch stop pattern 14 is removed through $CF_4$.

In some embodiments, after the first active pattern 11 is formed, the first active pattern 11 may be cut to obtain a sample, and the sample is detected. The sample is placed in hydrofluoric acid (HF) solution with a concentration of 1% for 20 seconds (s), then the sample is placed in SECOO for 20 S. SECOO is a mixture of HF and potassium dichromate ($K_2Cr_2O_7$), and then, the morphology of the grains 1100 in the first polysilicon material in the first active pattern 11 is observed through an SEM.

The manufacturing method for the thin film transistor 1 has the same beneficial effects as the thin film transistor 1 as described above, and details will not be repeated herein.

The foregoing descriptions are merely specific implementations of the present disclosure, but the protection scope of the present disclosure is not limited thereto. Any changes or replacements that a person skilled in the art could conceive of within the technical scope of the present disclosure shall be included in the protection scope of the present disclosure. Therefore, the protection scope of the present disclosure shall be subject to the protection scope of the claims.

What is claimed is:

1. A thin film transistor, comprising:
   a substrate;
   an active layer disposed on the substrate, the active layer having a channel region, the active layer including a first active pattern, at least one second active pattern, and at least one third active pattern, at least part of the first active pattern being located in the channel region;
   an etch stop pattern disposed on the top surface of the first active pattern, wherein an orthogonal projection of the first active pattern on the substrate is located within an orthogonal projection of the etch stop pattern on the substrate, and the orthogonal projection of the etch stop pattern on the substrate is non-overlapping with an orthogonal projection of the at least one second active pattern on the substrate; wherein the first active pattern includes a bottom surface, a top surface and at least one side surface, the bottom surface and the top surface are arranged opposite to each other in a thickness direction of the substrate, and the bottom surface is further close to the substrate; the at least one side surface connects the bottom surface and the top surface, and is in contact with the at least one second active pattern, and a length direction of each side surface of the at least one side surface is approximately perpendicular to a length direction of the channel region;

a material of at least the top surface of the first active pattern includes a first polysilicon material, a material of the at least one second active pattern includes a second polysilicon material; in the length direction of the channel region, an average grain size of the first polysilicon material is greater than an average grain size of the second polysilicon material;

a material of the at least one third active pattern is amorphous silicon;

the at least one third active pattern is disposed on at least one side of an active pattern group in the length direction of the channel region;

wherein the active pattern group includes the first active pattern and the at least one second active pattern.

2. The thin film transistor according to claim 1, wherein the at least one side surface includes a first side surface and a second side surface that are arranged opposite to each other in the length direction of the channel region; the at least one second active pattern includes second active patterns, and a second active pattern is in contact with the first side surface, and another second active pattern is in contact with the second side surface.

3. The thin film transistor according to claim 1, wherein a border of the orthogonal projection of the first active pattern on the substrate substantially coincides with a border of the orthographic projection of the etch stop pattern on the substrate.

4. The thin film transistor according to claim 1, wherein a material of the entire first active pattern is the first polysilicon material, or further includes a third polysilicon material; an average grain size of the third polysilicon material is less than the average grain size of the first polysilicon material.

5. The thin film transistor according to claim 1, further comprising a source and a drain that are disposed on a side of the at least one second active pattern away from the substrate, the source and the drain being electrically connected to the active layer.

6. A display apparatus, comprising the thin film transistor according to claim 1.

7. The thin film transistor according to claim 1, wherein the at least one third active pattern includes a plurality of third active patterns, the plurality of third active patterns are disposed on sides of the active pattern group in the length direction of the channel region.

8. The thin film transistor according to claim 1, wherein the at least one third active pattern includes one third active pattern, the third active pattern is arranged around the active pattern group.

9. The thin film transistor according to claim 1, further comprising:
an ohmic contact pattern disposed on a side of the active layer away from the substrate, the ohmic contact pattern being in contact with the active layer.

10. The thin film transistor according to claim 1, further comprising:
a gate disposed on a side of the active layer proximate to the substrate, or disposed on a side of the active layer away from the substrate.

* * * * *